US00RE47051E

(19) United States
(12) Reissued Patent
Ambrose et al.

(10) Patent Number: US RE47,051 E
(45) Date of Reissued Patent: Sep. 18, 2018

(54) CUSTOMIZATION OF MANUFACTURED PRODUCTS

(71) Applicant: W.A. Krapf, Inc., Macedon, NY (US)

(72) Inventors: Dennis W. Ambrose, Williamson, NY (US); Christian Q. Krapf, Rochester, NY (US)

(73) Assignee: W.A. Krapf, Inc., Macedon, NY (US)

(21) Appl. No.: 15/471,298

(22) Filed: Mar. 28, 2017

Related U.S. Patent Documents

Reissue of:
(64) Patent No.: 8,996,150
Issued: Mar. 31, 2015
Appl. No.: 12/931,732
Filed: Feb. 9, 2011

U.S. Applications:
(60) Provisional application No. 61/388,241, filed on Sep. 30, 2010.

(51) Int. Cl.
*G06F 19/00* (2018.01)
*G06Q 30/06* (2012.01)
*G06F 17/50* (2006.01)

(52) U.S. Cl.
CPC ..... *G06Q 30/0621* (2013.01); *G06F 17/50* (2013.01)

(58) Field of Classification Search
CPC ..... G06Q 30/0621; G06F 17/50
USPC ..... 700/97; 705/26.5, 27.2; 715/961
See application file for complete search history.

(56) References Cited

U.S. PATENT DOCUMENTS

| | | | | |
|---|---|---|---|---|
| 6,384,850 | B1 | 5/2002 | McNally et al. | |
| 6,871,325 | B1 | 3/2005 | McNally et al. | |
| 6,968,255 | B1 * | 11/2005 | Dimaridis | D05B 19/08 112/475.19 |
| 6,982,733 | B1 | 1/2006 | McNally et al. | |
| 7,177,719 | B2 * | 2/2007 | Arkay-Leliever | B44C 7/02 700/131 |
| 7,274,378 | B2 | 9/2007 | McAvoy et al. | G06F 17/30241 345/629 |
| 7,430,343 | B2 * | 9/2008 | Hayes et al. | 382/305 |
| 7,457,683 | B2 * | 11/2008 | Bailie | D05B 19/08 112/470.01 |
| 7,785,526 | B2 * | 8/2010 | Voisin | 264/496 |
| 7,860,691 | B2 * | 12/2010 | Beltran | G06F 17/50 345/419 |
| 8,898,556 | B2 * | 11/2014 | Grosz | G06F 17/3028 715/205 |
| 2008/0177410 | A1 * | 7/2008 | Carbonera | 700/98 |
| 2009/0122329 | A1 * | 5/2009 | Hegemier et al. | G06T 11/60 358/1.9 |

* cited by examiner

*Primary Examiner* — Deandra Hughes
(74) *Attorney, Agent, or Firm* — Woods Oviatt Gilman LLP; Dennis B. Danella, Esq.

(57) ABSTRACT

A system, apparatus and method for a person to communicate customized design information for an object, such as a product at a time prior to its manufacture. A network accessible communications channel and user interface is provided that enables the person to communicate design information, including a visual representation of the product, prior to its manufacture.

29 Claims, 19 Drawing Sheets

300

CUSTOMIZATION OF MANUFACTURED PRODUCTS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED PATENT APPLICATIONS

This is a non-provisional patent application that claims priority and benefit to U.S. provisional patent application Ser. No. 61/388,241 that was filed on Sep. 30, 2010 and entitled "Design Customization of Manufactured Products", the aforementioned (61/388,241) patent application is incorporated herein by reference in its entirety.

FIELD OF THE INVENTION

This invention generally relates to a system, apparatus and method for a person to communicate custom design information associated with an object, such as a product to be manufactured. A user interface, and optionally a communications channel, is provided that enables the person to communicate the customized design information, including a visual representation associated with the object, prior to its manufacture.

COMPUTER PROGRAM LISTING APPENDIX

Enclosed with the specification are two (2) compact discs (Copy 1 and Copy 2) which are identical. The files recorded on each of the attached compact discs (Copy 1 and Copy 2) are associated with a software application of the invention. The software application is designed to interoperate with modern browsers such as Internet Explorer (Version 8) and Firefox (Version 3.6.12). These files include ASCII encoded files that are listed within this computer program listing appendix (See below). These ASCII encoded files are stored within hierarchy of file folders having a root file folder named "UDesignIT" at its highest level. The ASCII encoded files are each incorporated herein by reference.

Each file folder (listed below) was created on Dec. 29, 2010, unless indicated otherwise. Each ASCII file was created on Dec. 3, 2010, unless indicated otherwise. As indicated otherwise, each ASCII file located within (UDesignIT\files\) folder was created on Dec. 15, 2010. Listed below is each ASCII encoded file that is represented on one line of text including its file name and its size in units of bytes.

| | | | |
|---|---|---|---|
| Folder Name: | UDesignIT | | |
| File Name: | index.html | Size: | 3,018 Bytes |
| File Name: | Render PDF.jsx | Size: | 3,365 Bytes |
| Folder Name: | UDesignIT\files\ | Size: | 361,553 Bytes |
| Files in this (UDesignIT\files\) folder were each created on Dec. 15, 2010. | | | |
| File Name: | Custom Image Calendar.xml | Size: | 7,137 Bytes |
| File Name: | FIG. 1A.xml | Size: | 191 Bytes |
| File Name: | FIG. 1B.xml | Size: | 1,104 Bytes |
| File Name: | FIG. 1C.xml | Size: | 625 Bytes |
| File Name: | FIG. 3A.xml | Size: | 191 Bytes |
| File Name: | FIG. 3B.xml | Size: | 473 Bytes |
| File Name: | FIG. 3C.xml | Size: | 508 Bytes |

-continued

| | | | |
|---|---|---|---|
| File Name: | FIG. 3D.xml | Size: | 561 Bytes |
| File Name: | FIG. 3F.xml | Size: | 574 Bytes |
| File Name: | FIG. 3G.xml | Size: | 733 Bytes |
| File Name: | FIG. 4A.xml | Size: | 401 Bytes |
| File Name: | FIG. 4B.xml | Size: | 557 Bytes |
| File Name: | FIG. 4C.xml | Size: | 713 Bytes |
| File Name: | FIG. 4D.xml | Size: | 841 Bytes |
| File Name: | FIG. 4E.xml | Size: | 1,011 Bytes |
| File Name: | FIG. 4F.xml | Size: | 1,194 Bytes |
| File Name: | FIG. 5.xml | Size: | 5,234 Bytes |
| File Name: | OverView Calendar.xml | Size: | 30,141 Bytes |
| File Name: | Safety Cross Scoreboard.xml | Size: | 8,423 Bytes |
| File Name: | Step Tracker.xml | Size: | 22,180 Bytes |
| File Name: | Student Progress Tracker.xml | Size: | 225,257 Bytes |
| File Name: | YearMaster Calendar.xml | Size: | 53,504 Bytes |
| Folder Name: | UDesignIT\forms\full\ | Size: | 21,669 Bytes |
| File Name: | board_form1.html | Size: | 2,142 Bytes |
| File Name: | cell_form1.html | Size: | 3,018 Bytes |
| File Name: | col_form1.html | Size: | 2,266 Bytes |
| File Name: | file_form1.html | Size: | 876 Bytes |
| File Name: | grid_form1.html | Size: | 1,465 Bytes |
| File Name: | image_form1.html | Size: | 1,509 Bytes |
| File Name: | main_form1.html | Size: | 3,464 Bytes |
| File Name: | row_form1.html | Size: | 2,463 Bytes |
| File Name: | tdex_form1.html | Size: | 744 Bytes |
| File Name: | text_form1.html | Size: | 3,649 Bytes |
| File Name: | text_list_form1.html | Size: | 73 Bytes |
| Folder Name: | UDesignInscripts\config\ | Size: | 26,211 Bytes |
| File Name: | designit.js | Size: | 24,434 Bytes |
| File Name: | designit_config.js | Size: | 1,777 Bytes |
| Folder Name: | UDesignInscripts\controllers\ | Size: | 51,445 Bytes |
| File Name: | designit_board_controller.js | Size: | 861 Bytes |
| File Name: | designit_controller.js | Size: | 3,408 Bytes |
| File Name: | designit_editor.js | Size: | 20,410 Bytes |
| File Name: | designit_file_controller.js | Size: | 1,097 Bytes |
| File Name: | designit_grid_controllerjs | Size: | 14,294 Bytes |
| File Name: | designit_image_controller.js | Size: | 3,130 Bytes |
| File Name: | designit_tdex_controller.js | Size: | 2,515 Bytes |
| File Name: | designit_text_controller.js | Size: | 5,730 Bytes |
| Folder Name: | UDesigninscripts\core\ | Size: | 49,692 Bytes |
| File Name: | designit_board.js | Size: | 4,573 Bytes |
| File Name: | designit_grid.js | Size: | 10,776 Bytes |
| File Name: | designit_grid_cell.js | Size: | 11,860 Bytes |
| File Name: | designit_grid_col.js | Size: | 4,345 Bytes |
| File Name: | designit_grid_row.js | Size: | 4,351 Bytes |
| File Name: | designit_image.js | Size: | 5,464 Bytes |
| File Name: | designit_tdex.js | Size: | 2,304 Bytes |
| File Name: | designit_text.js | Size: | 6,019 Bytes |
| Folder Name: | UDesignInscripts\other\ | Size: | 7,970 Bytes |
| File Name: | global.js | Size: | 2,707 Bytes |
| File Name: | html_encode.js | Size: | 4,142 Bytes |
| File Name: | rgb_color.js | Size: | 1,121 Bytes |
| Folder Name: | UDesignIT\scripts\other\jscolor\ | Size: | 30,581 Bytes |
| File Name: | jscolor.js | Size: | 24,883 Bytes |
| Folder Name: | UDesignIT\scripts\rendering\indd\ | Size: | 23,327 Bytes |
| File Name: | designit_render_indd.jsx | Size: | 13,264 Bytes |
| File Name: | designit_xml_indd.jsx | Size: | 10,063 Bytes |
| Folder Name: | UDesignIT\scripts\rendering\web\ | Size: | 43,257 Bytes |
| File Name: | designit_pixel_sizejs | Size: | 3,155 Bytes |
| File Name: | designit_render_html.js | Size: | 20,274 Bytes |
| File Name: | designit_xml_web.js | Size: | 19,828 Bytes |
| Folder Name: | UDesignIT\stylesheets\ | Size: | 6,022 Bytes |
| File Name: | full.css | Size: | 1,780 Bytes |
| File Name: | global.css | Size: | 374 Bytes |
| File Name: | texgyreheros.css | Size: | 3,868 Bytes |

BACKGROUND OF THE INVENTION

A customized design of an object, such as a product, is typically an iterative process that requires final approval from a person providing the design prior to manufacture the product. In some circumstances, the iterative process is time consuming and inefficient and manufacture of the customized product can result in a less than satisfactory result due to lack of complete communication between a person, and the manufacturer receiving, the customized design.

This circumstance applies to the manufacture of a customized display board. A customized display board could include a one or more customized and printed display patterns. The variety and extent of these patterns can vary and include nearly limitless variations and combinations.

SUMMARY OF THE INVENTION

The invention relates to a system, apparatus and method for a person to communicate customized design information for an object at a time prior to its manufacture. A user interface, and optionally a communications channel to transmit the user interface, is provided that enables the person to communicate design information, including a visual representation of the product, prior to its manufacture. In some embodiments, the product is automatically manufactured in accordance with the encoded description of the product.

In some embodiments, the visual representation is constructed by the person by configuring at least one of text and graphics that are arranged in accordance with a plurality of one or more multi-cell grid patterns. In some embodiments, the grid patterns include rows and columns each having at least one independent and variable dimension. In some embodiments, the grids patterns are arranged hierarchically.

BRIEF DESCRIPTION OF THE DRAWINGS

The objects and features of the invention can be better understood with reference to the claims and drawings described below. The drawings are not necessarily to scale, and the emphasis is instead generally being placed upon illustrating the principles of the invention. Within the drawings, like reference numbers are used to indicate like parts throughout the various views. Differences between like parts may cause those like parts to be each indicated by different reference numbers. Unlike parts are indicated by different reference numbers.

DETAILED DESCRIPTION OF THE INVENTION

Figure 1A:
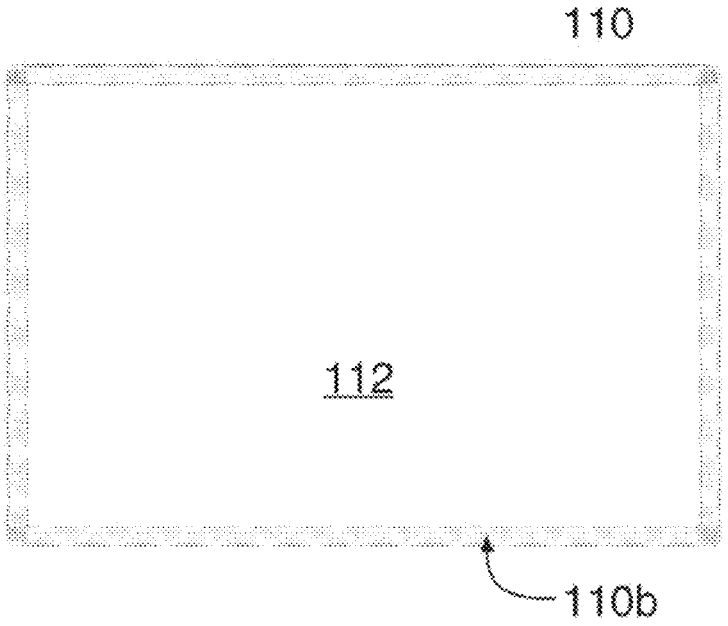
FIG. 1A illustrates a front view of a first embodiment of an exemplary display board, representative of an object to be manufactured by means of the present invention.

FIG. 1A illustrates a frontal view of an exemplary first embodiment of a display board 110. The type of display board shown is referred to as a dry erase display board 110 or "white board" 110. The display board 110 is defined by a board element consisting of a front panel that is retained along each of its lateral edges within a display/drawing area portion 112 and a frame portion 110b. In this embodiment, the display/drawing area 112 is also referred to herein as a drawing surface 112, a display surface 112, a drawing area 112 or a display area 112. The display/drawing area 112 is surrounded by a frame 110b along each of its lateral edges thereof defining its outer perimeter.

The display area 112 is a planar surface that is constructed from a metal alloy, such as steel that is coated with a substance, typically of a shade of white color, that can be further and permanently coated with other substances of various colors and patterns (not shown) during its manufacture. After manufacture and shipment to a person (user) of the display board, the display area 112 surface can be further drawn (printed) upon by a user applying various substances, including colored inks, such as inks provided from colored markers (not shown).

The user-applied inks are designed to be removable from the display/drawing area 112 by the user via application (physical rubbing/wiping) of a hand held eraser or wipe cloth onto the display/drawing area 112. The hand held eraser is typically made from a dry and cloth-like material. Other substances, including liquids, can be applied to the drawing/display area 112 to remove user applied inks.

The frame 110b surrounds the perimeter of the display/drawing surface 112 and provides mechanical support for attachment of the display board 110 to a wall surface (not shown) or for support of the display board 110 from a floor mounted stand (not shown). The frame 110b is preferably made from a rigid material, such as aluminum, which can be customized to project each of a variety of different appearances and colors, such as silver, black and wood grain.

Figure 1B:
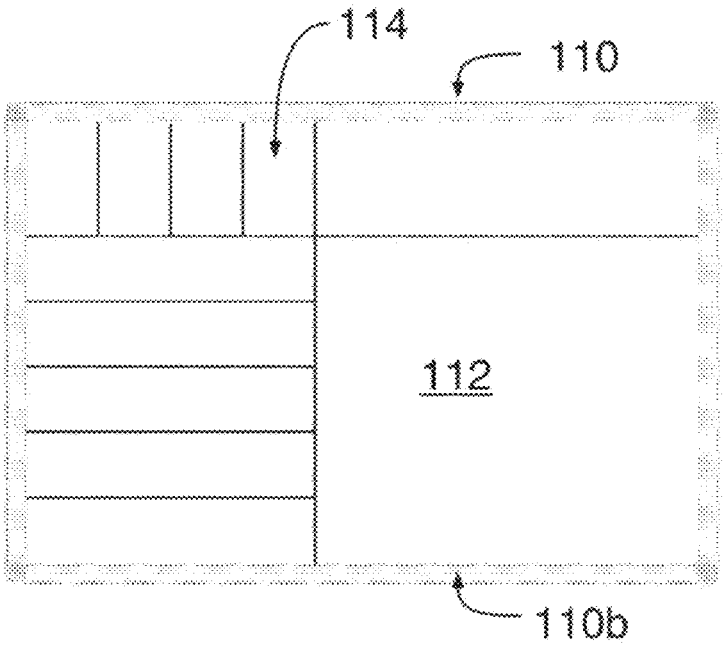
FIG. 1B illustrates a front view of a second embodiment of an exemplary display board.

FIG. 1B illustrates a frontal view of a second embodiment of a display board 110. The type of display board shown is referred to as a "pre-printed" or 'pre-patterned" display board 110. The display area portion 112 includes a manufactured printed (drawing) pattern 114 defined in this instance by a series of horizontal and vertical drawing lines extending along portions of the drawing/display area 112. The variety and extent of these lines/patterns can vary and include nearly limitless variations and combinations. This drawing pattern is not erasable as it is applied to the drawing area 112 during manufacture of the display board 110. The drawing area 112 is surrounded by a frame 110b along a outer perimeter of the display area portion 112.

Like the display board 110 of FIG. 1A, a user can draw over the manufactured drawing patter by applying substances, such as inks that are designed to also be removable from the display area 112. The manufactured drawing pattern 114 can be a standard pattern selected by a person, or customized by the person at a time of purchase and prior to manufacture of the display board 112.

Figure 1C:
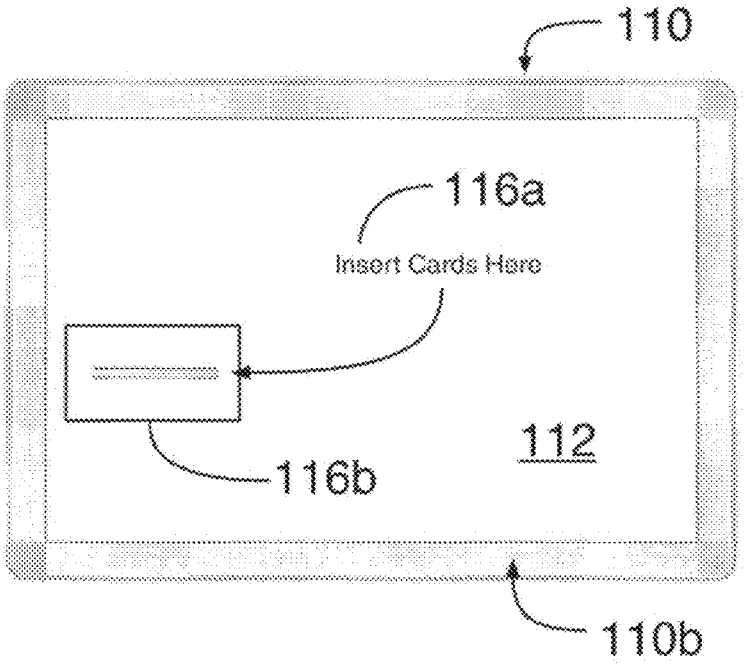
FIG. 1C illustrates a front view of a third embodiment of an exemplary display board.

FIG. 1C illustrates a front view of a third exemplary embodiment of a display board 110. The type of display board shown is referred to as a pre-printed or pre-patterned display board 110 that further includes at least one other manufactured feature. In this specific embodiment, the other manufactured feature is at least one slot (opening) 116b that is cut into the display area 112. Only one slot is provided in this embodiment, but additional slots can be provided in other embodiments.

In this embodiment, the display area 112 functions as both a sign and as a mechanism to collect items, such as tickets, cards or other media including paper. These items can be inserted through the slot 116b. The display area portion 112 includes a drawn (printed) pattern 116a, that is text reciting "Insert Cards Here" and that is non-erasable and applied to the display area 112 during manufacture of the display board 110. The display area 112 is surrounded by a frame 110b, along an outer perimeter of the drawing area portion 112. Unlike the display board 110 of FIG. 1A, the pre-printed (patterned) display area 112 is not intended to be further drawn upon.

Figure 2A:
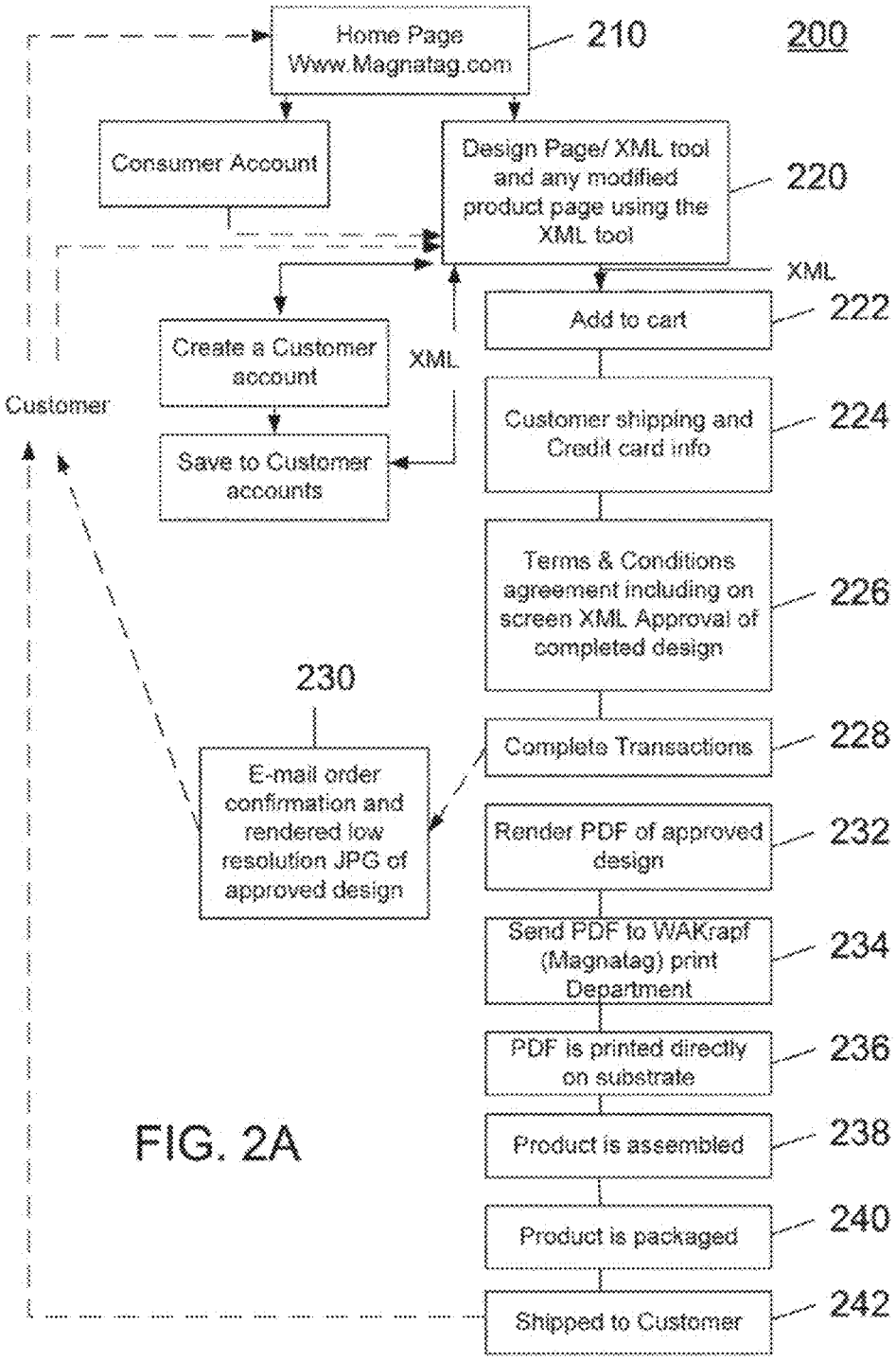
FIG. 2A illustrates a flow chart of a system for user communicated design of custom manufactured objects, such as the exemplary display boards described herein.

FIG. 2A illustrates a flow chart 200 of an embodiment of a system for receiving directives from a person (customer) regarding a custom design for a manufactured product, such as for a custom design of a display board 110. As shown, the manufacturer of a product line, such as of a display board 110, provides an interactive user interface (product design page) that is accessible via a communication channel, such as Internet web access to a web site, for use by a person who is interested in obtaining a custom designed display board 110.

In some embodiments, the web site 210 (e.g. www.magnatag.com) restricts access to a product design page 220, and requires that a person (product purchaser) possess design page access rights to access the design page 220. The product design page 220, includes a plurality of user interface screens, also referred to herein as the user interface, that collectively enable the person to select a particular product type and to select among various pre-defined features (configurable attributes) that are associated with the selected product type. The product design page 220 further enables the person to additionally specify (define) and draw within a visual representation, non-predefined features of the product prior to its manufacture.

Figure 4A:
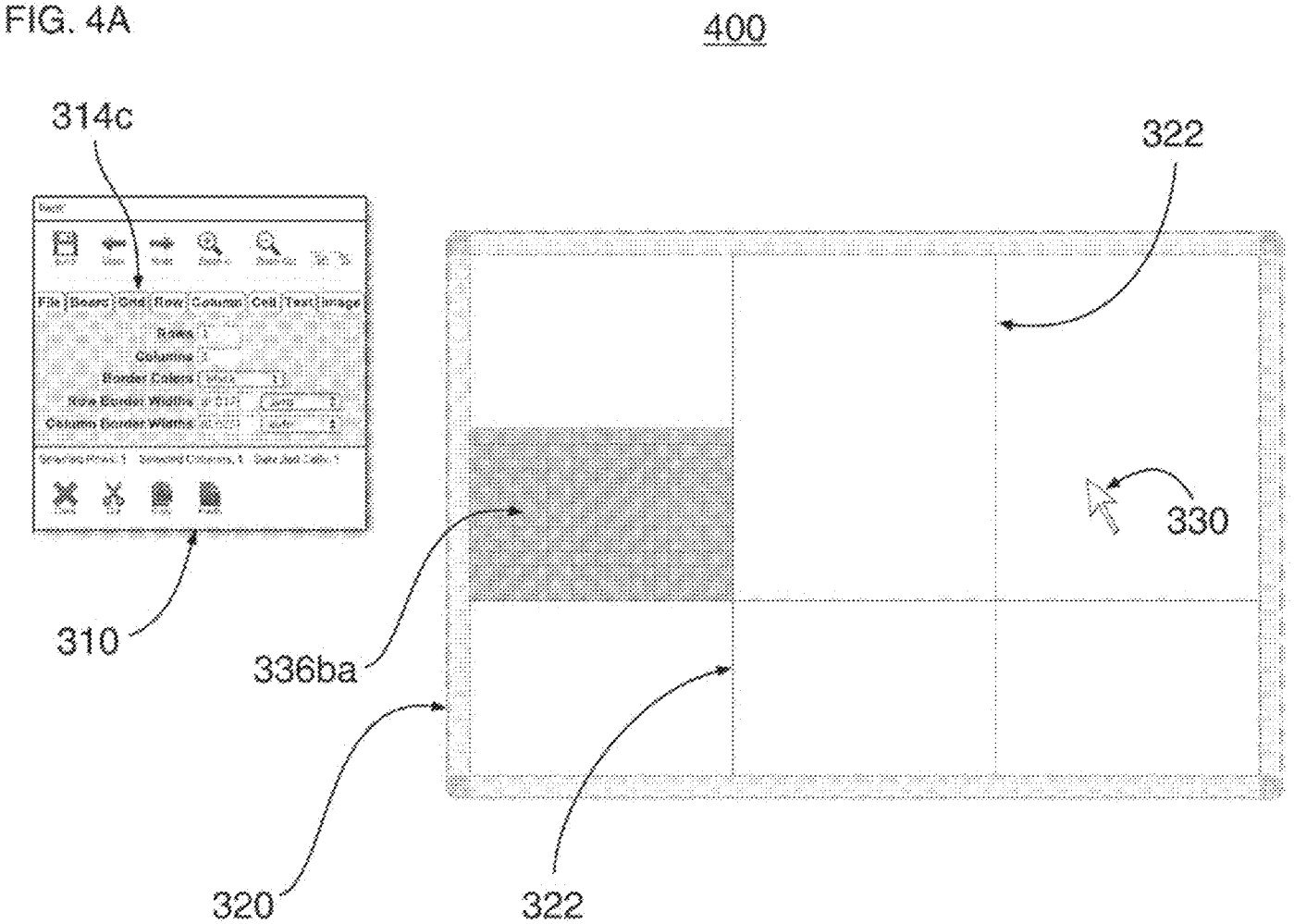
FIGS. 4A-4F illustrate additional functionality provided by a user interface including incorporation of one or more nested grids.
Figure 4B:
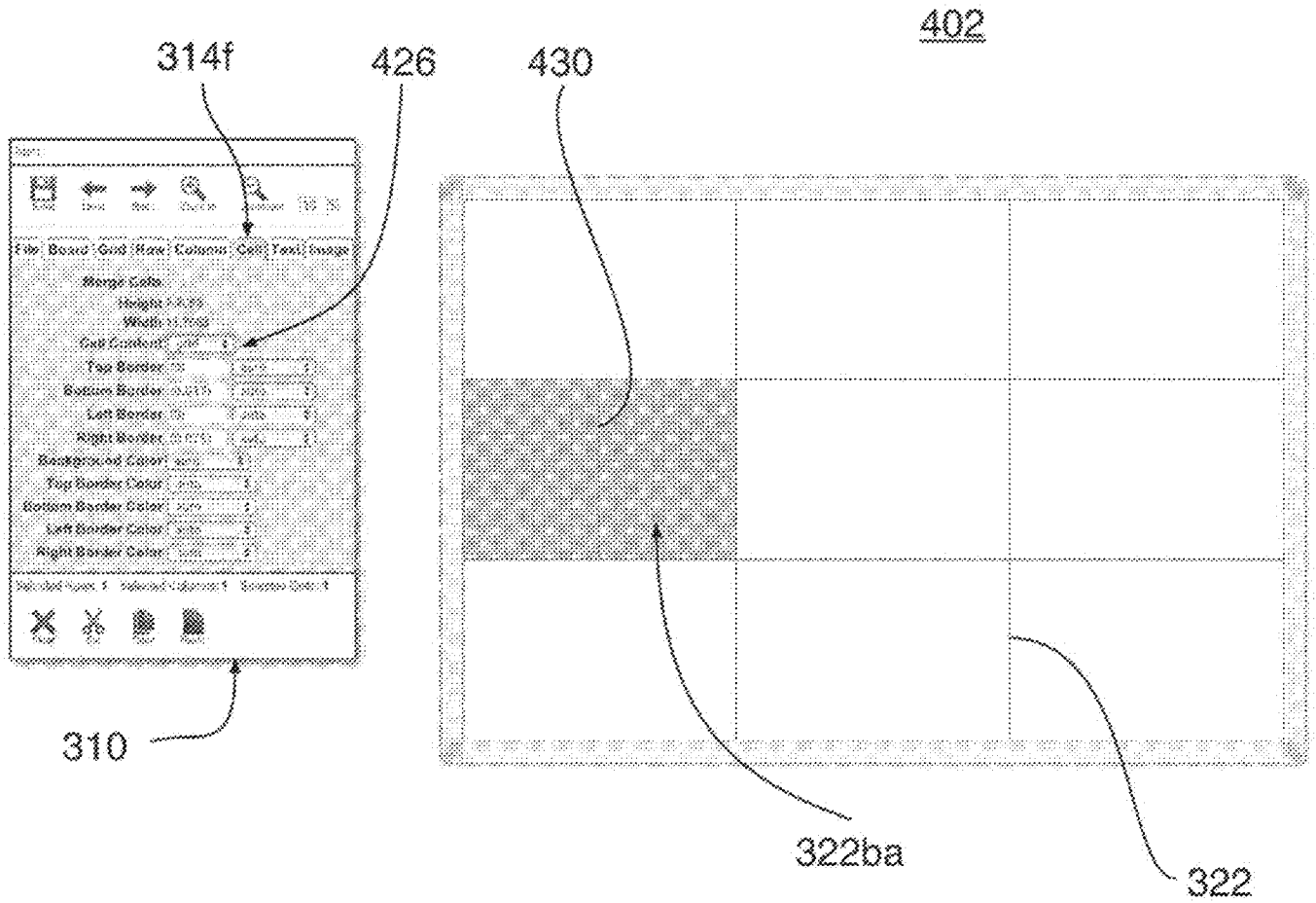
Figure 4C:
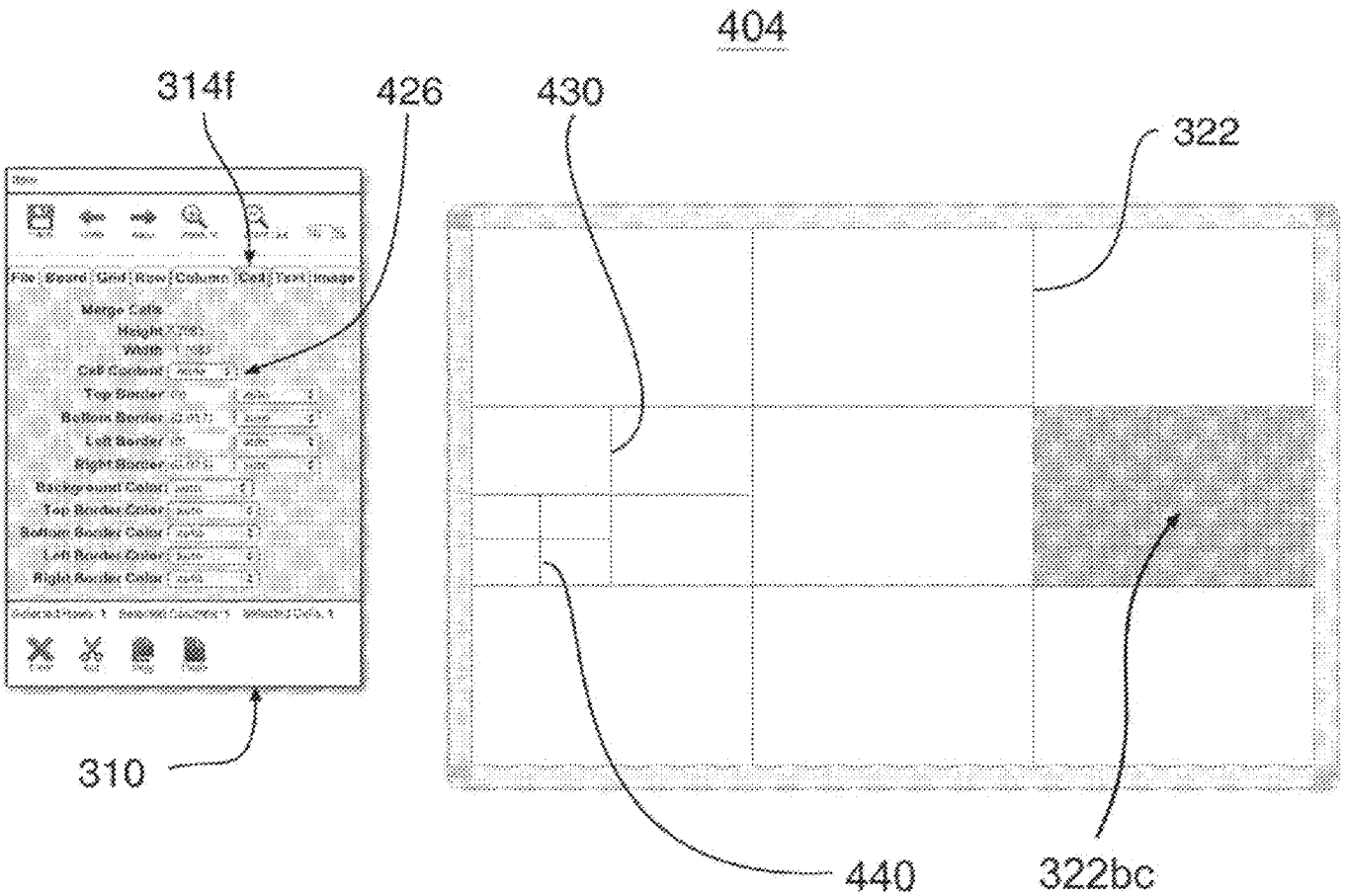
Figure 4D:
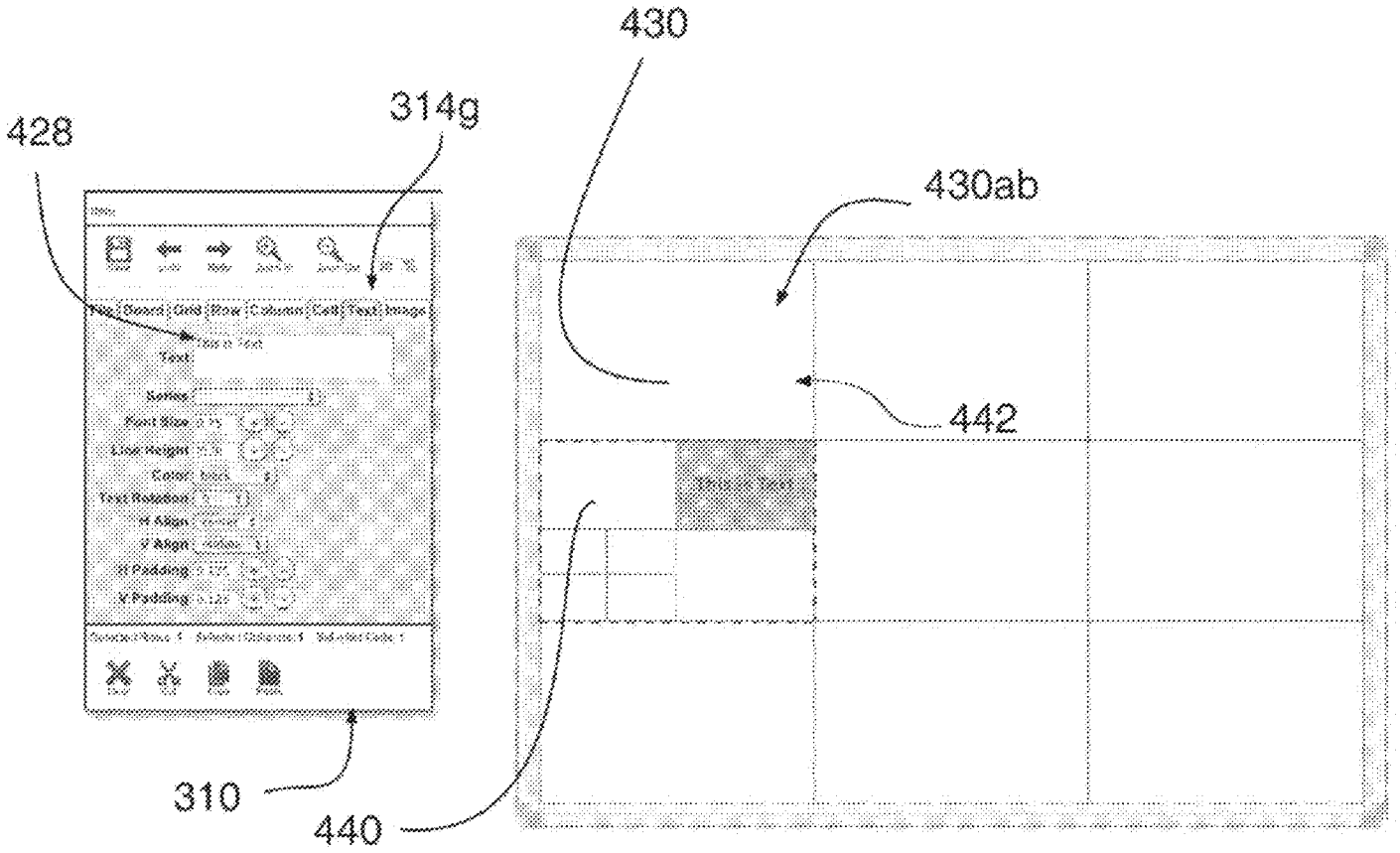
Figure 4E:
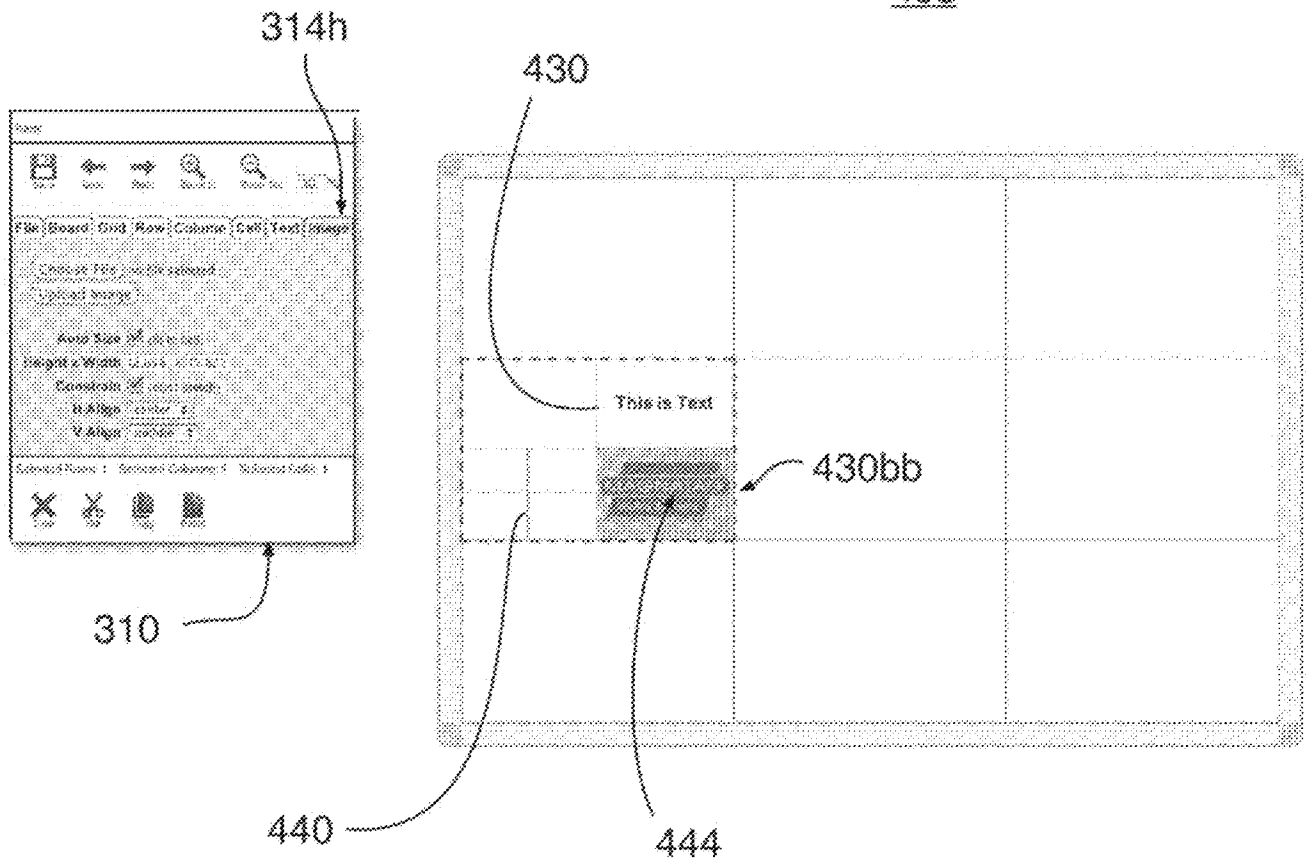
Figure 4F:
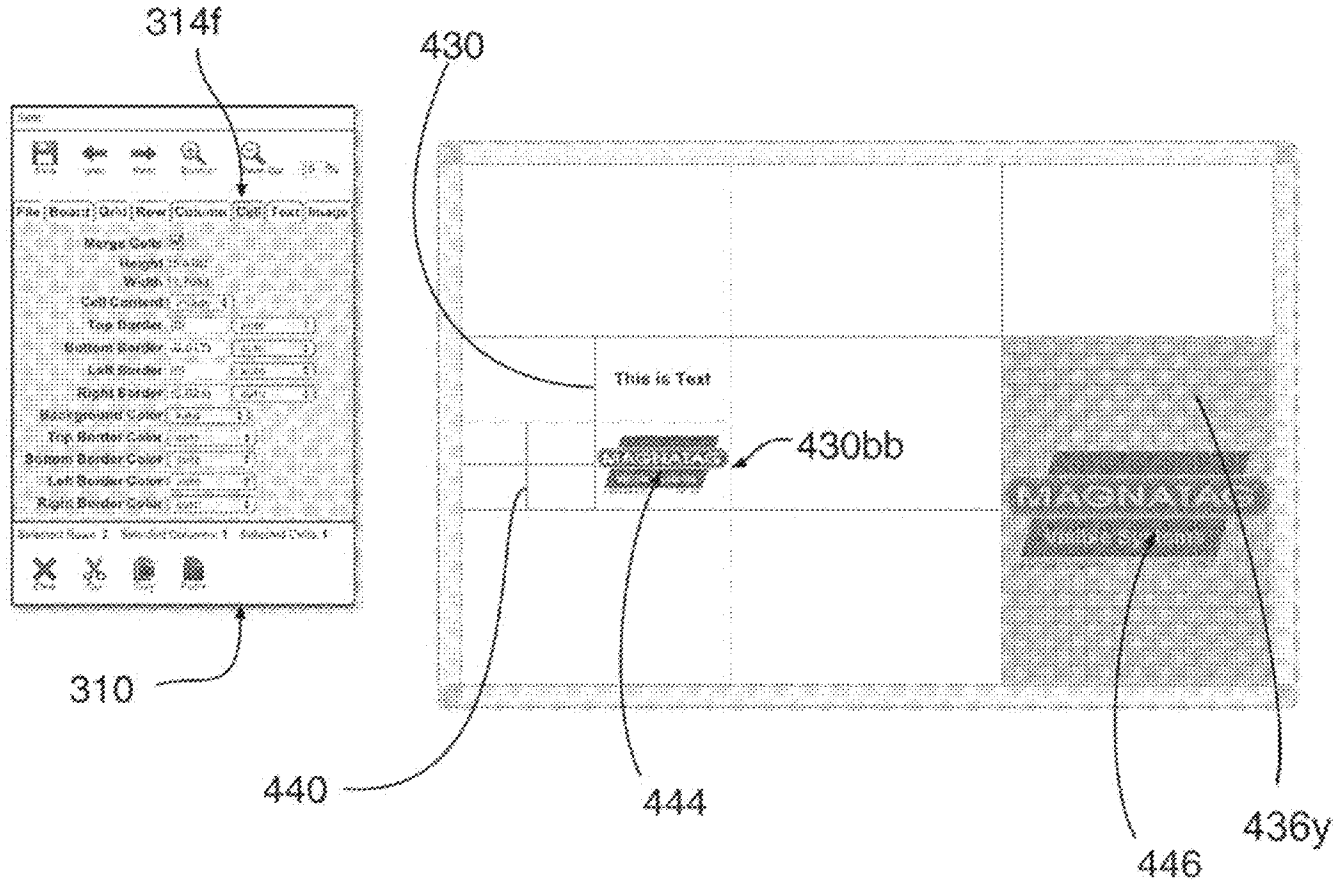
Figure 5:
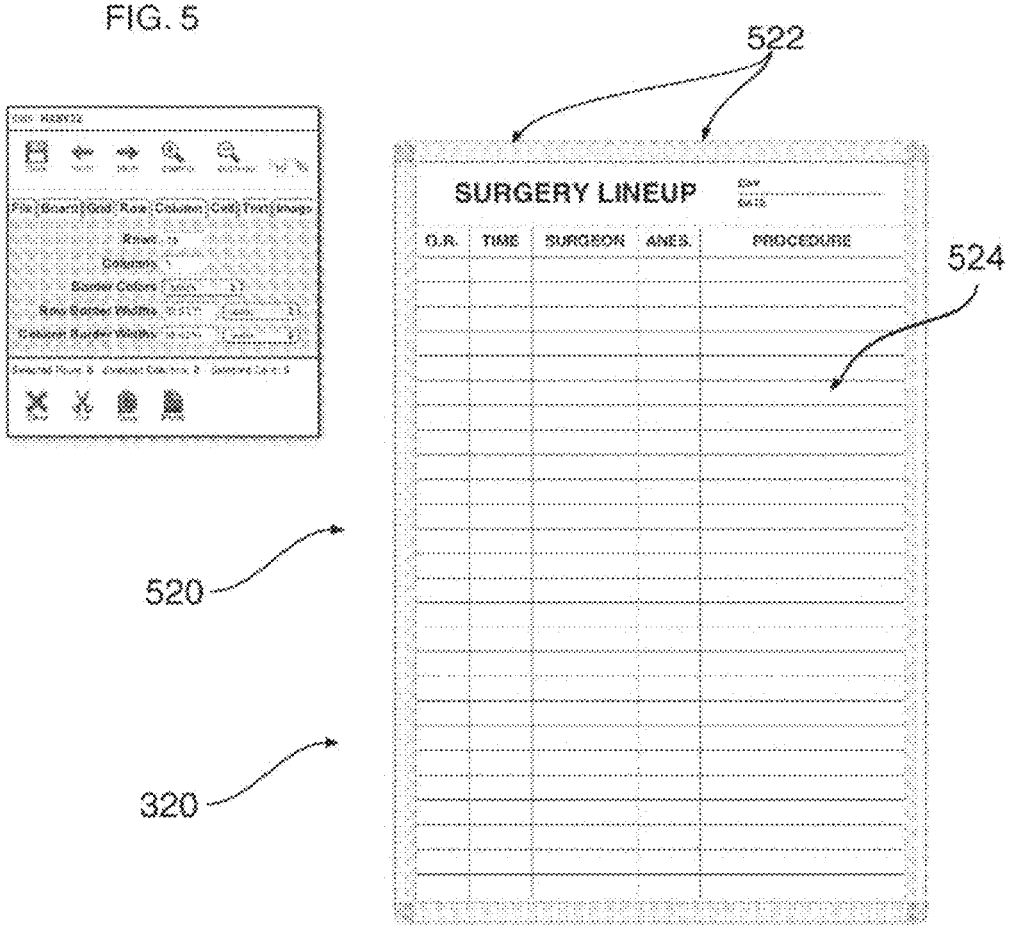
FIG. 5 is an illustration of a more complex product design having an exemplary screen grid including twenty-eight rows and five columns.

When interfacing with the product design page 220, the person communicates directives to specify product features, such as a type and size of a display board, by entering information associated with selection options listed within one or more user interface screens (See FIGS. 3-5). The selection of a pre-printed (patterned) display board 110 also provides an option for the person to select a pre-printed display area pattern from a variety of pre-designed display area patterns via the product design page 220, and/or for the person to communicate a specified (defined) display area pattern for inclusion onto a display area 112 of a selected display board 110.

The product design page 220 provides a plurality of one or more grids that can be defined and dimensioned to include variable numbers of rows and columns. Each grid includes one or more rows and one or more columns. Each row has a default height value and each column has a default width value. Each row can be configured to have a particular height that is independent of a height of each of the other rows within the grid. Each column can be configured to have a particular width value that is independent of the width of each of the other columns within the grid.

The area of intersection of a particular row and a particular column defines an area of a cell. The area of a cell is generally rectangular and is bounded by (4) boundaries. Each of the (4) boundaries of the cell are collinear with either one of an intersecting row boundary or of an intersecting column boundary. Each grid includes at least one row and at least one column, and hence each grid includes at least one cell. Also, the grids can be hierarchically arranged where, for example, a second (child) grid can be defined to reside within a cell of a first (parent) grid.

In some embodiments of the user interface is implemented as a software program that executes on a multitasking operating system based computer. Optionally, this program can be implemented using higher level programming language tools. Regardless of how this software program is implemented, each board, grid and cell that are visible to the user are preferably each instantiated as software objects during execution of the program. These objects are constructed within a hierarchy inside of this program.

Preferably, a board object is constructed to include a hierarchy of content objects, for example, to include at least a grid object and a text object. The content objects implement a method called "renderHTML." When a content object's renderHTML method is called (invoked), this function performs necessary rendering (user interface screen drawing) tasks that are associated with that object. A text content object will render the text it contains with associated properties such as text font size and weight. A grid content object's renderHTML method will render its rows, columns and cells according to their respective properties such as border thickness and color.

In addition to properties (attributes) associated with appearance, each grid cell has a property (attribute) to designate its content. The content property of a grid cell can be set to either null (empty cell) or is set to an instance of one of the many types of content objects. If a cell is not empty it will call (invoke) the cell's content property's object's renderHTML method if and when the cell's renderHTML method is called, regardless of what type of content is set within the grid cell. This method calling (invocation) constitutes a portion of a cascade of (recursive) method calling (invocation) traveling through the object hierarchy associated with a board object. This cascade of rendering continues until the nested grids and their cell's contents within the hierarchy are rendered.

The above-described hierarchical model enables each of a plurality of nested content objects to inherit properties (attributes) from their associated parent grid cell. For example if a parent cell's background color property is set to the color red, then any content (including grids) rendered inside of that cell will have a background color set to the color red by default, unless otherwise specified. Grids depend on this hierarchy inheritance type of feature to determine the bounds of their height and width. A grid object is as wide and as high as it's parent cell.

In addition to the renderHTML method each content object implements a loadXML and renderXML method. These methods are also called (invoked) within a hierarchical cascade of recursive method calling (invocation) as described above for the renderHTML method. Preferably, other types rendering methods, such as renderPDF, are implemented in the same manner as described above.

As a simple example of a board object hierarchy, a cell object including a text object resides below a grid object which resides below the board object within the hierarchy. As constructed within this hierarchy, a cell object obtains its boundaries from its parent object within the hierarchy. In this circumstance, a cell's parent object is a grid object. The grid object obtains its boundaries from its parent object. In this circumstance, the parent grid's parent object is a board object. Each object within the hierarchy renders its image onto the user interface screen.

In other circumstances, the object hierarchy includes multiple nested grid objects. In this type of circumstance, a first grid residing lower in the hierarchy obtains its boundaries from a cell object of a second grid object residing above it within the object hierarchy. The second grid object obtains its boundaries from a cell object of a third grid residing above the second grid within the object hierarchy. A board object at the top of the hierarchy provides boundary information to objects below it within the object hierarchy.

As a software program, the user interface directs operations of a processor, such as a central processing unit (CPU) operating within a Microsoft Operating system based computer. The computer preferably operates and interfaces with a publically accessible computer network, such as the Internet, to enable a variety of users to interact with the user interface software program. Preferably, the user interface software program is accessible from a web site that is accessible via the computer network. In some embodiments, the method, apparatus or system of the invention, spans across state or national boundaries and may involve a network that spans across state or national boundaries.

While interfacing with the user interface software program, the person can optionally assign text, a graphic or an image or another grid into a grid cell. As preferably designed, the content of a grid cell is not permitted to visually extend outside boundaries of the grid cell. For example, oversized text within a cell is cropped (clipped) at each boundary of the cell. Each boundary of a cell can be represented by a line having visible and configurable attributes or alternatively be represented as not being visible at all.

The product design page 220, providing access to the above described user interface software program, enables the person to iteratively revise manufacturer pre-defined and person defined product attributes. Manufacturer pre-defined attributes can include discrete object size options and selection of particular materials for which to manufacture the object. Person defined attributes can include customized images including text, graphics and capture images that are drawn upon the manufactured object. Upon completing revisions to a product design, the person saves the product design as a digital file within non-volatile storage. In some embodiments, the digital file includes an extensible markup language (XML) encoded description of the product design.

In some embodiments, upon completion of communicating a product design, the person (user) selects "Add to Cart" 222 to indicate purchase of the designed product. The person communicates credit card information 224 and reads a "Terms and Conditions" screen 226, and reviews a representation of the product design retrieved from the XML digital file and indicates "Approval" 226, and indicates "Completion of Transaction" 228. Completion of step 228 queues an order for the product and causes communication of an electronic mail confirmation 230 to the person in association with an order for manufacture of the designed product. The email confirmation (not shown) includes information summarizing the product design being ordered for manufacture and an image representation of the visual design of the product, as defined by the person via the product design page 220. In some embodiments, the image can be encoded within a .JPG or .PDF type of file formatted representation.

The XML file (not shown) includes instructions that are interpreted by a graphics program to construct an image representation of the product design. In some embodiments, the XML is transformed to a PDF formatted file 232 and communicated 234 for printing onto a substrate 236 within a facility of the manufacturer. In some embodiments, the substrate is a display area 112 of a display board 110. The display pattern is rendered onto a display area 112 of the display board 110 from information within the PDF file. The product is assembled 238, packaged 240 and shipped to the person (customer) 242.

Figure 2B:
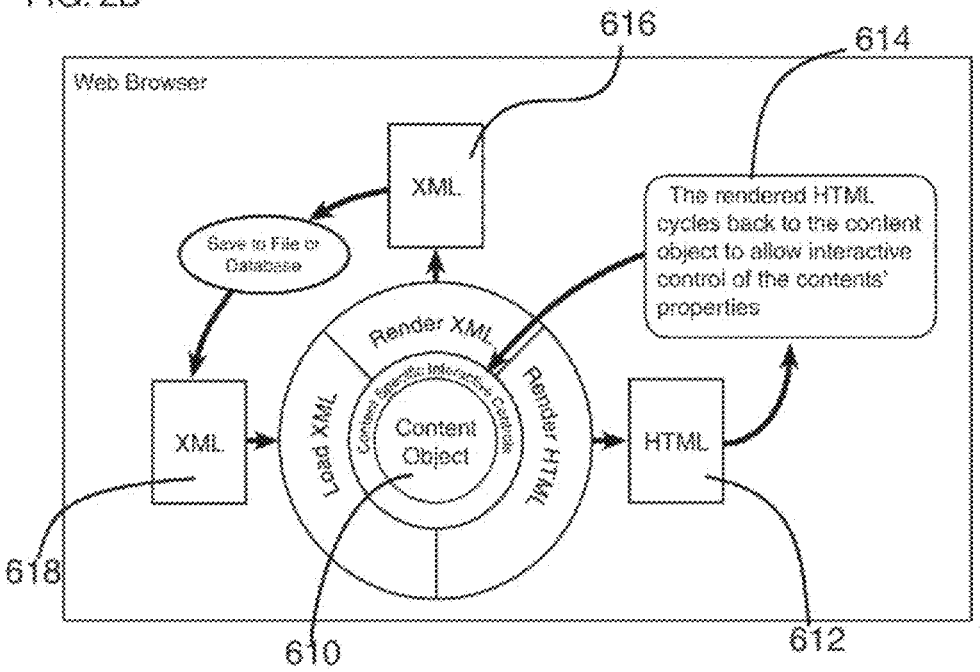
FIGS. 2B-2C are block diagrams illustrating various relationships between operations associated with the user interface and data that is processed.

FIG. 2B is a block diagram illustrating various general relationships between operations associated with the user interface as implemented via a web browser program. As shown, an encoded data representation of a product design, where the product design is specified via interaction with a person via the user interface, is stored into a Content Object 610. The Content Object data 610 is transformed into hypertext markup language (HTML) 612 for rendering onto a display screen (not shown here) of a web browser for viewing by a user of the user interface. The user can revise the Content Object data 610 via interaction with the user interface via the web browser. In this circumstance, the revisions to the Content Object data are cycled back 614 and re-stored into the content object 610.

The Content Object data 610 is transformed into extensible markup language (XML) 616 and stored as XML 616 onto a non-volatile data storage device. The stored XML is re-loaded (transformed) 618 into the Content Object 610 within a Web browser and further transformed into hypertext markup language (HTML) and processed by the user interface to enable viewing and further revision (editing) to the product design by the user via the user interface.

Figure 2C:
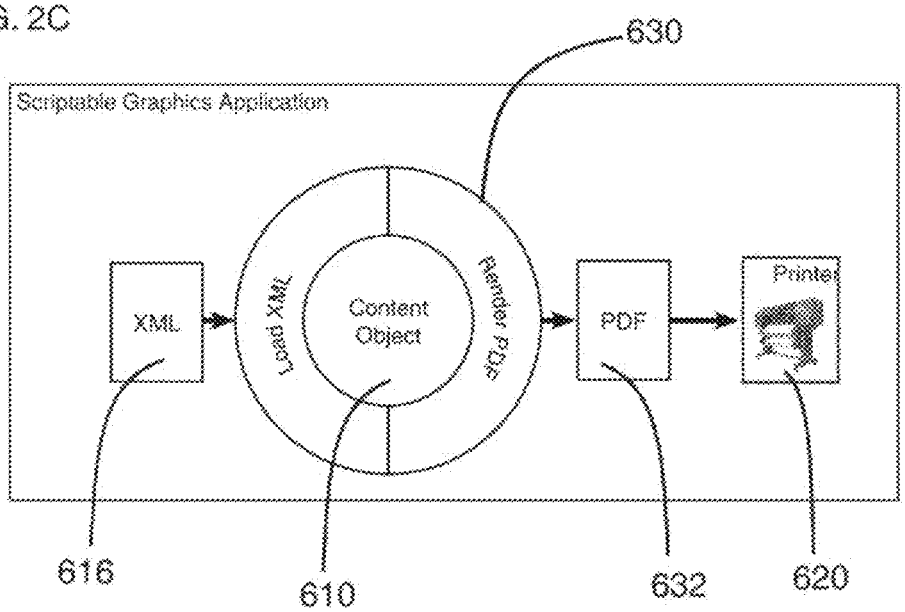

FIG. 2C illustrates the operation of a scriptable graphics application 630. This application can be implemented as a software program 630 that controls computer hardware. As shown, the program 630 is configured to recognize and process the XML 616 and to transform the XML 616 into another graphics representation, such as into an Adobe PDF representation. In some embodiments, the PDF representation 618 is communicated to an output device 620 or other device that is designed to process the PDF representation to facilitate manufacture of the designed product in accordance with the information encoded within the Content Object data 610. In some embodiments, the manufacturing process for the designed product in accordance with the PDF representation is entirely automated and requiring no human intervention, or substantially automated and requiring minimum human intervention.

Figure 3A:
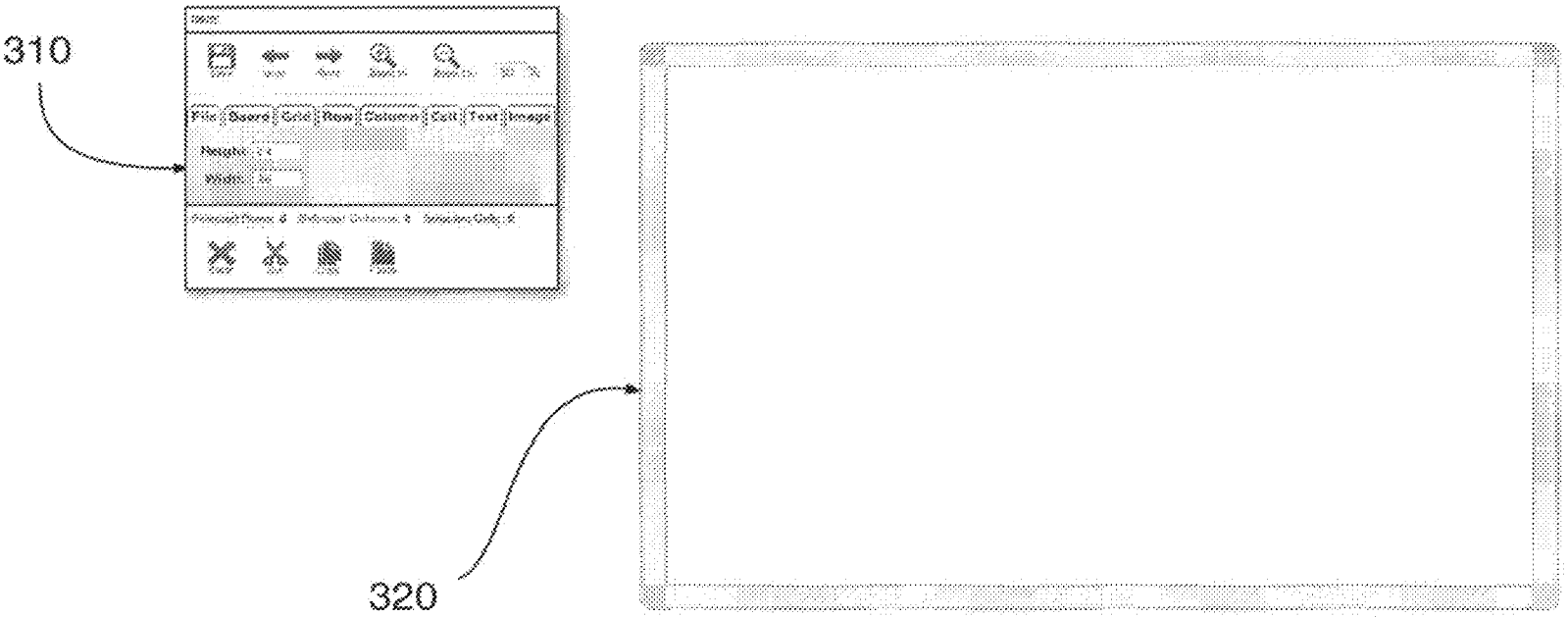
FIGS. 3A-3G illustrate various functionality provided by a user interface including a product (object) design screen.
Figure 3A:
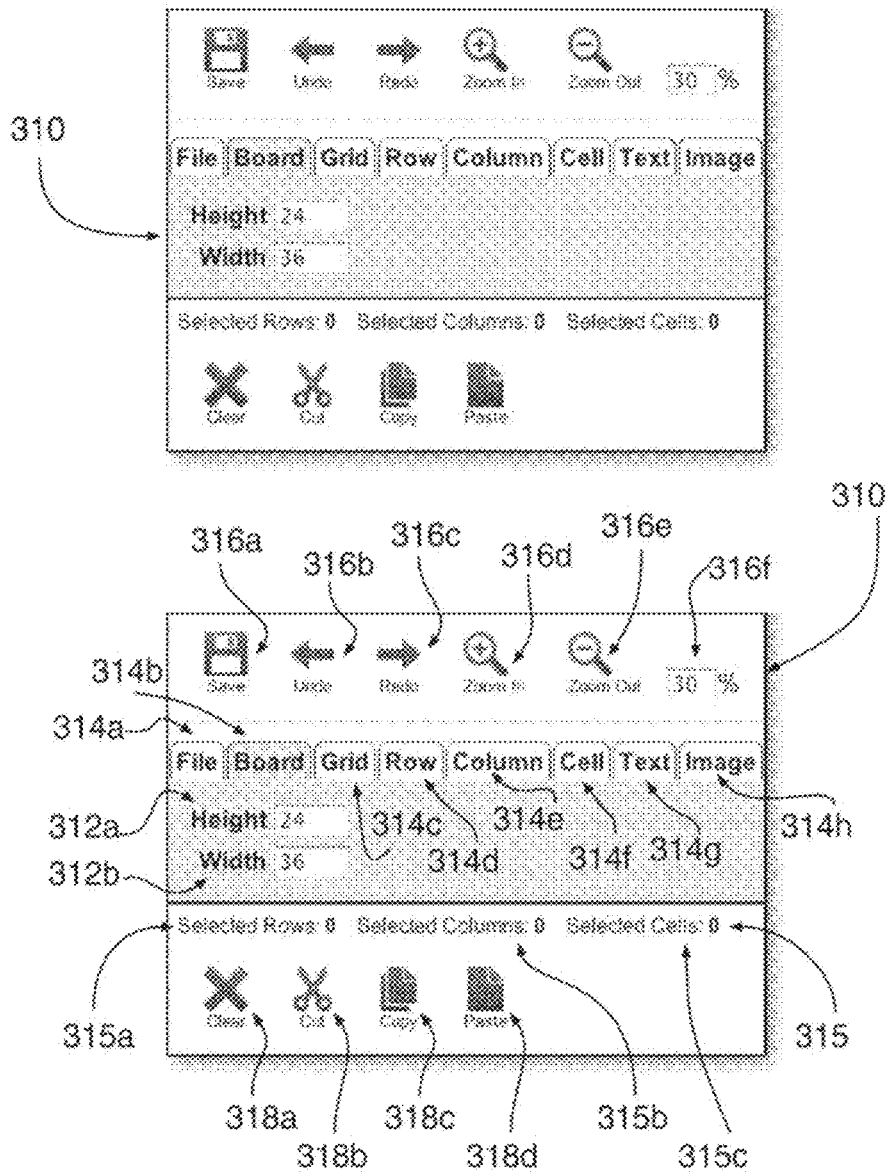

FIG. 3A is an illustration of an embodiment of a dialog box portion of a user interface screen 300 that is associated with a product design page 220 (See FIG. 2A). The user interface screen 300 includes a dialog box 310 that is located at the upper left corner of the user interface screen 300, and a display area window 320 that is located an the right side of the user interface screen 300 (See FIG. 3B). The content of the dialog box 310 includes a plurality of tab buttons 314a-314h and other text, menu and push button fields 316a-316f, 315a-315c and 318a-318d (See FIG. 3A continued). The state and content of the dialog box 310 is dependent upon a currently selected tab button 314a-314h. As shown, the currently selected tab button is the tab button 314b that is labeled "Board", which according to this exemplary embodiment is a default selection.

Figure 3B:
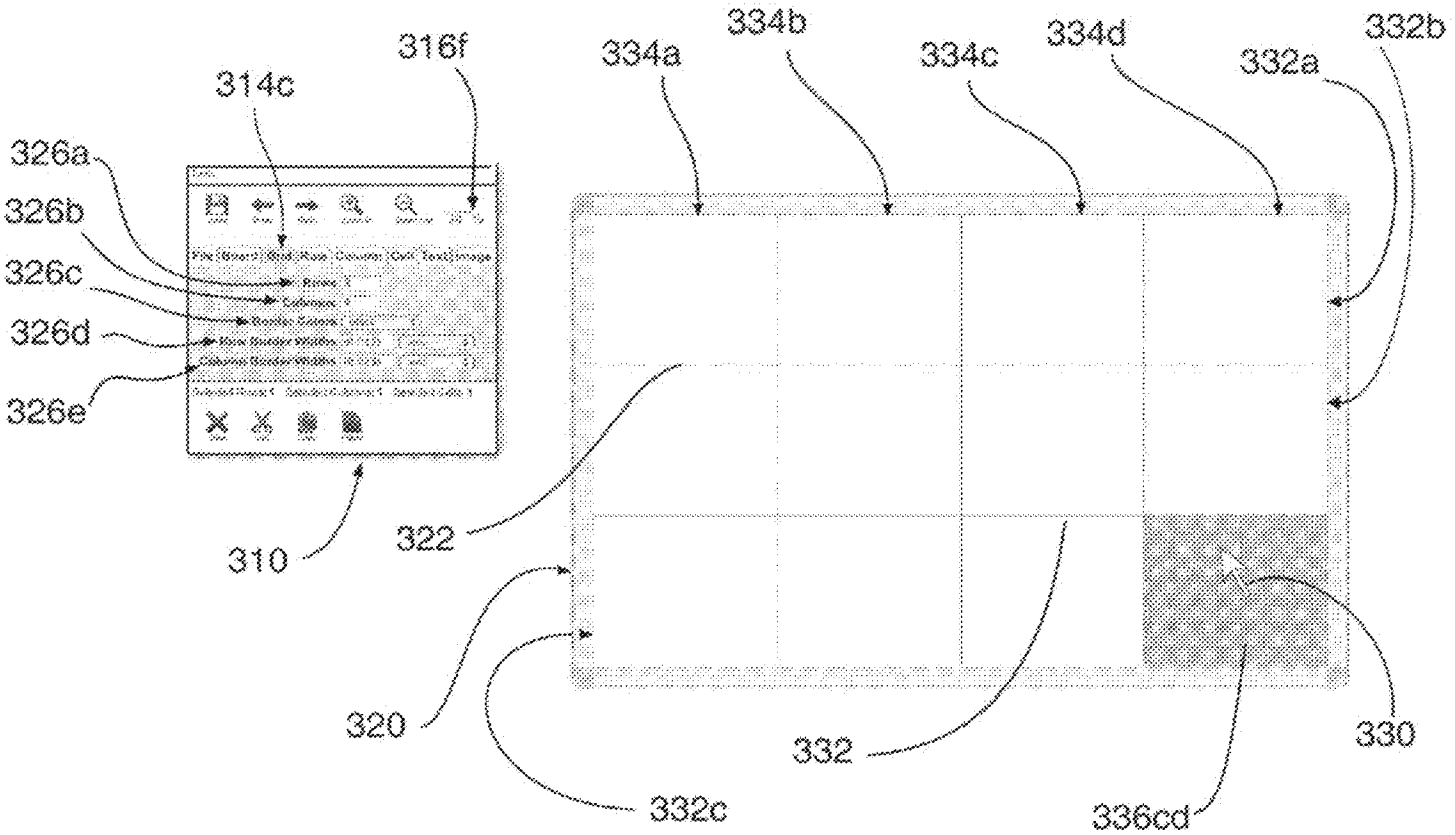

Like that shown in FIG. 3B, the user interface screen 300 of FIG. 3A includes the display area window 320 that represents the visual content of a display area 112 of a display board 110, as shown in FIGS. 1A-1C, and as specified by the person communicating a custom design to the manufacturer of the display board 110. Currently, the display area window 320 is empty. A text field 312a labeled "Height" indicates that the height of the display board 110 as it is to be manufactured is 24 inches high. A text field 312a labeled "Width" indicates that the width of the display board 110 as it is to be manufactured is 36 inches wide.

In accordance with the invention, the dimensions of the display board 110 to be manufactured are configurable and can each be set to equal various display board dimensions. For example, in other embodiments, the height and width of the display board can be configured to equal 48 inches and 72 inches respectively. Each of these parameters, among others, can be varied by the user through the user interface screen 300.

FIG. 3B is an illustration of an embodiment of another user interface screen 350 associated with a product design page 220. The currently selected tab button is the tab button 314c, labeled "Grid". The display area window 320 includes a grid 322 having (3) rows and (4) columns and (12) cells. Currently, the content of the grid 322 is empty, meaning that the cells of the grid 322 include no other information, and consequently include no text, no graphics or images and no other nested grids. A pointing device (mouse) cursor 330 is also shown as being currently located within the cell 336cd located within the grid 322 of the display area window 320.

The dialog box 310 also includes a text entry field labeled "Rows" 326a, a text entry field labeled "Columns" 326b, and a menu selection field labeled "Border Colors" 326c, a menu selection field labeled "Row Border Widths" 326d and a menu selection field labeled "Column Border Widths" 326e. A selected value of each menu selection field is displayed in association with each of the above menu selection fields.

A zoom (percentage) field 316f indicates a relative size between the physical size of the display area window 320 and the physical size of the display area 112 of the display board 110 that is to be manufactured. A zoom level field 316f indicates a zoom value equal to 30 percent (30%). For example, to represent a physical display area 112 of a display board 110 to be manufactured, that is 36 inches in width and 24 inches in height, a zoom value equal to 30 percent (30%) would be in accordance with size dimensions of the display area window 320 equaling approximately 10.8 inches in width and approximately 7.2 inches in height, as it is displayed (rendered) onto a user interface screen.

A rows text entry field 326a indicates the number of rows (3) that reside within a grid residing within the display area window 320. A columns text entry field 326b indicates the number of columns (4) of the grid that resides within the display area window 320.

By default, the height of each row is automatically set to be proportional to the height of the display area 112 of the board 110. The height of the display area 112 can be further and optionally modified by adjustments, which when modified, is referred to as a modified height of the display area 112. Without adjustments, each of the (3) rows 332a-332b has a default height equal (24 inches/3 columns) which is equal to 8 inches. With adjustments, each of the (3) rows 332a-332b has a default height equal to a modified height of the display area 112 divided by the number of rows.

By default, the width of each column is automatically set to be proportional to the width of the display area 112 of the board 110. The width of the display area 112 can be further and optionally modified by adjustments, which when modified, is referred to as a modified width of the display area 112. Without adjustments, each of the (4) columns 334a-334d has a default height equal (32 inches/4 columns) which is equal to 8 inches. With adjustments, each of the (4) columns 334a-334d has a default width equal to a modified width of the display area 112 divided by the number of columns.

In some embodiments, the adjustments account for an overlap of the frame 110b which surrounds the perimeter and that can encroach upon the display area 112. In some embodiments, a horizontal and vertical dimension of a non-encroached portion of the display area 112 are each reduced by 0.75 inches respectively, to account for overlap of the frame 110b over the perimeter of the display area 112.

Hence, an adjusted display area height, adjusted for perimeter frame encroachment, would equal (24 inches-0.75 inches)=23.25 inches and an adjusted display width would equal (36 inches-0.75 inches)=35.25 inches. These adjustments affect automatic the computation of row height and column width. As a result, the adjusted row height would equal about (23.25 inches)/3 rows)=7.75 inches, and the adjusted column width would equal about (35.25 inches/4 columns)=8.8125 inches.

Note that if multiple grids reside within the display area window 320, the Rows/Columns field 326a-326b applies to a currently selected grid. By default, the currently selected grid is equal to the top level grid 322. As shown, the grid 320 is the only currently displayed grid.

As shown, the display area window 320 includes a top level grid 322 that includes (3) rows 332a-332c and (4) columns 334a-334d. A cell 336aa-336cc is defined by the intersection between each row 332a-332c and each column 334a-334d. For example, the cell 336aa is defined by the intersection of row 332a and column 334a. The cell 336bc is defined by the intersection of row 332b and column 334c, etc.

A "Border Colors" menu field 326c controls a default border color for lines of the currently selected grid. A "Row Border Widths" menu field 326d controls a width value for a border for each row within the currently selected grid. A "Column Borders" menu field 326e controls a width value for a border for each column within the currently selected grid.

The cursor 330 is shown as being located within cell 336cd. The cursor 330 is employed to select a cell within the grid 322 as a prerequisite for entry of text and/or graphics into the cell 336cd, or for selection of a grid other than grid 322 (not shown) that could be nested within the selected cell. The cursor 330 can also be employed to select multiple cells while pressing a keyboard SHIFT key or other controls keys if so configured.

Figure 3C:
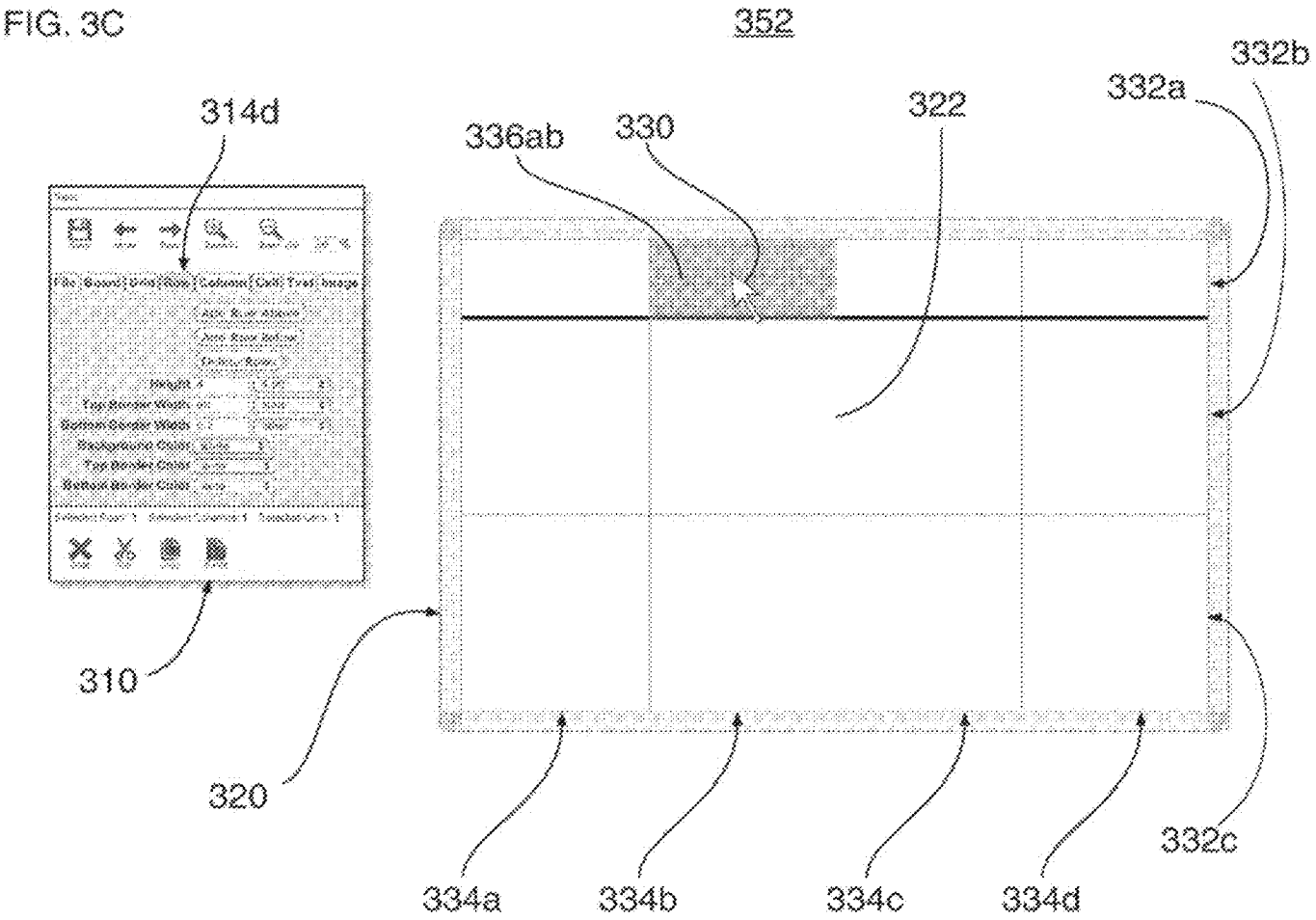

FIG. 3C is an illustration of an embodiment of a user interface screen image 352 associated with a product design page 220. Within the associated dialog box 310, the currently selected tab button is the tab button 314d, labeled "Row". The dialog box 310 also includes a push button labeled "Add Row Above", a push button labeled "Add Row Below" and a push button labeled "Delete Rows", that each apply to a currently selected row or rows. The dialog box 310 also includes menu entry fields labeled "Height", "Top Border Width", "Bottom Border Width", "Background Color", "Top Border Color" and "Bottom Border Color", that are attributes that each apply to a currently selected row.

As shown, cell 336ab, residing within row 332a and column 334b, is selected. Also, the row 332a, within which cell 336ab is located, is also selected. The cursor 330 is shown as being located within cell 336ab. The dialog box 310 indicates that the height of the row 332a, within which cell 336ab is selected, is set to a value of 4 inches (without adjustments), as opposed to its original height of about 8 inches (without adjustments) (See FIG. 3B). The height of the other (2) rows 332b-332c, is automatically reset to ((24−4)/2) inches, equaling about 10 inches (without adjustments). Furthermore, the bottom border width of the selected row 332a is set to 0.2 inches of width. By default, the border width of this row would be equal to 0.017 inches. Note that the horizontal and vertical dimension of a display area 112 is reduced by 0.75 inches to account for overlap of a perimeter frame that encroaches the display area 112. This affects automatic computation of row height and column width.

Figure 3D:
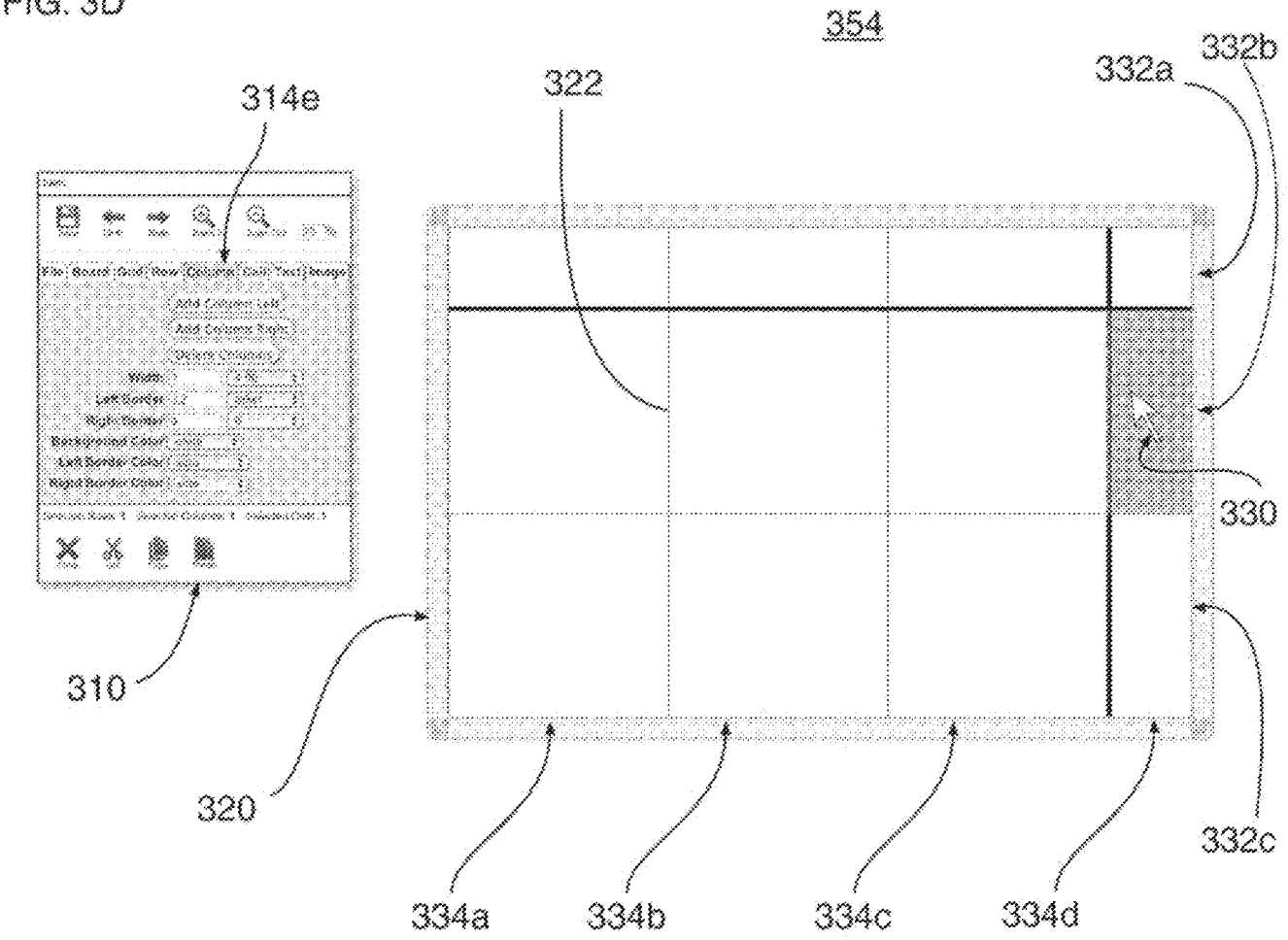

FIG. 3D is an illustration of an embodiment of a user interface screen image 354 associated with a product design page 220. Within the dialog box 310, the currently selected tab button is the tab button 314e, labeled "Column". The dialog box 310 also includes a push button labeled "Add Column Left", a push button labeled "Add Column Right" and a push button labeled "Delete Columns", that each apply to a currently selected column or columns. The dialog box 310 also includes menu entry fields labeled "Width", "Left Border", "Right Border", "Background Color", "Left Border Color" and "Right Border Color", "Background Color", "Left Border Color" and "Right Border Color", that are attributes that each apply to a currently selected column.

As shown, cell 336bd, residing within row 332b and column 334d, is selected. The cursor 330 is shown as being located within cell 336bd and is employed to select cell 336bd. The dialog box 310 indicates that the width of the column 334d, within which cell 336cb is located and selected, is set to a value of 4 inches (unadjusted), as opposed Wits original width of approximately 8 inches (unadjusted) (See FIG. 3B). The width of each of the other (3) columns 334a-334c, is automatically reset to approximately ((32−4)/3) inches, equaling about 9.33 inches (unadjusted). Furthermore, the left border width of the selected column 334d is set to 0.2 inches of width. By default, the border width of this row would be equal to 0.017 inches.

As shown in FIGS. 3C-3D, dimensions of individual rows and columns can be individually modified in order to create a grid having non-uniform sized (dimensioned) rows and/or non-uniform sized (dimensioned) columns, and further, non-uniform border widths for each of the rows and columns.

Figure 3E:
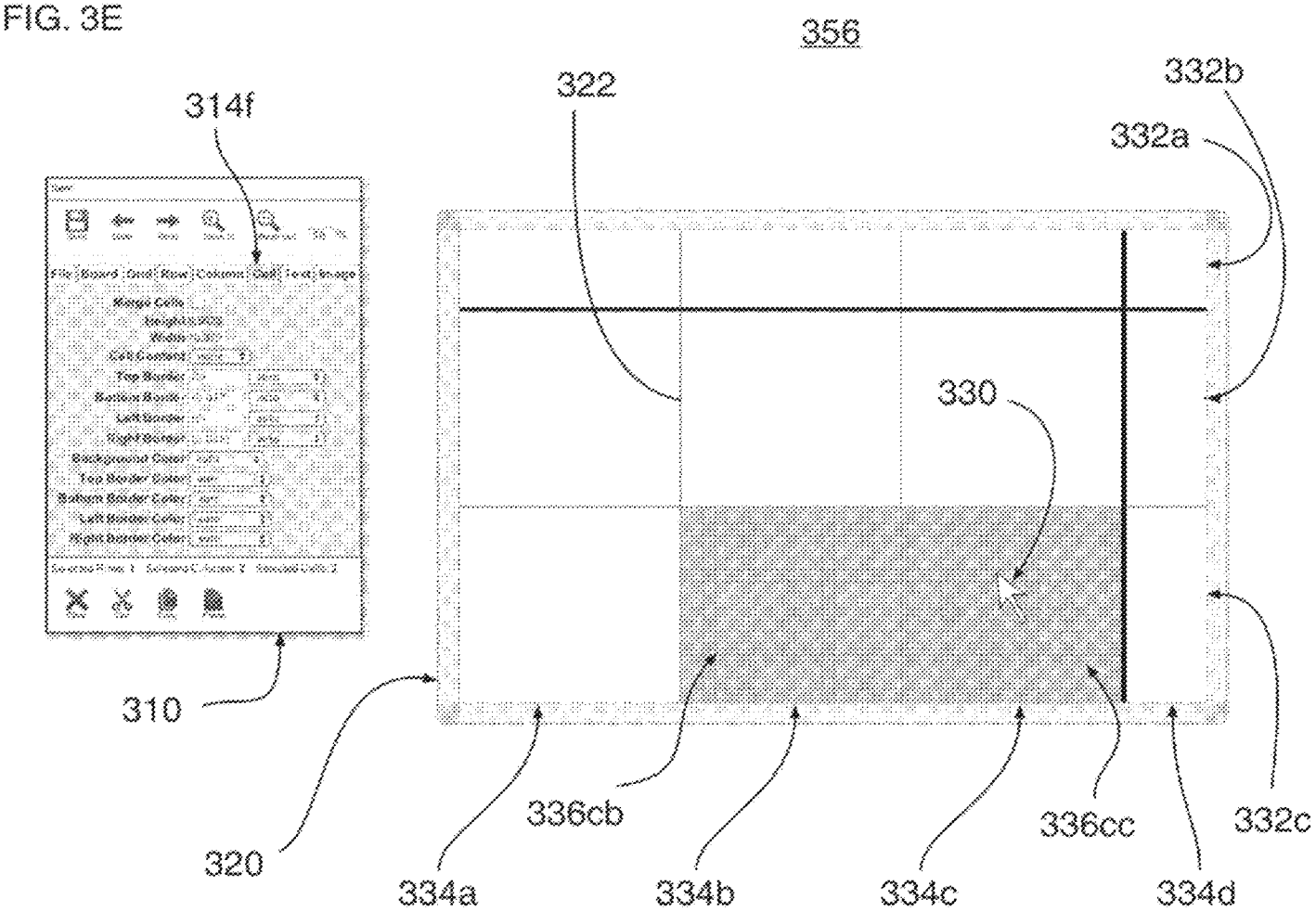

FIG. 3E is an illustration of an embodiment of a user interface screen image 356 associated with a product design page 220. Within the dialog box 310, the currently selected tab button is the tab button 314f, labeled "Cell". The dialog box 310 also includes a check box labeled "Merge Cells", (2) text display fields that are each labeled "Height" and "Width", (10) menu entry fields that are labeled "Top Border", "Bottom Border", "Left Border" "Right Border", "Background Color", "Top Border Color", "Bottom Border Color", "Left Border Color" and Right Border Color" being attributes of a currently selected cell.

As shown, cell 336cb and cell 336cc are both selected via the screen pointer 330 while holding down the SHIFT key. The cell 336cb resides within row 332c and column 334b. The cell 336cc resides within row 332c and column 334c. The screen pointer (cursor) 330 is shown as being located within cell 336cc. The dialog box 310 indicates that the height of cell 336cc is equal to 9.5625 inches and the width is equal to 10.375 inches (as manufactured). Note that the "Merge Cells" check box is unchecked.

Figure 3F:
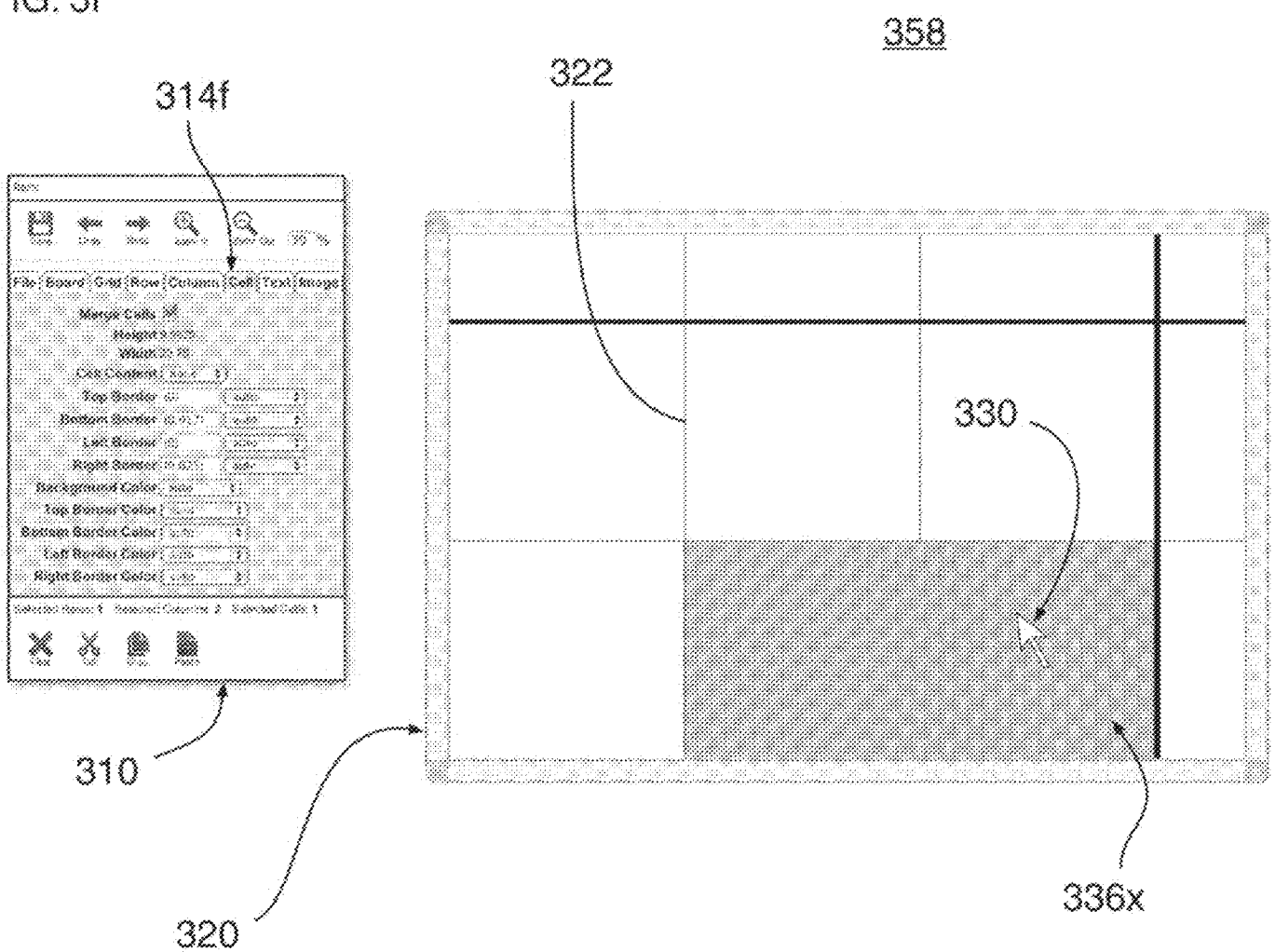

FIG. 3F is an illustration of an embodiment of a user interface screen image 358 associated with a product design page 220. Like for FIG. 3E, the currently selected tab button within the dialog box 310 is the tab button 314f, labeled "Cell". Unlike for FIG. 3E, the "Merge Cells" check box is checked. This action indicates that cells 336cb and 336cc are merged into one cell. The dialog box 310 indicates that merged cell has a height (Height) equal to 9.5625 inches (adjusted), the same height as for each of the cells 336cb and 336cc, before these cells 336cb-336cc are merged together. The dialog box indicates that the merged cell has a width (Width) equal to 20.75 inches (adjusted) (as manufactured), which is the sum of the individual width values for each cell 336cb-336cc.

Figure 3G:
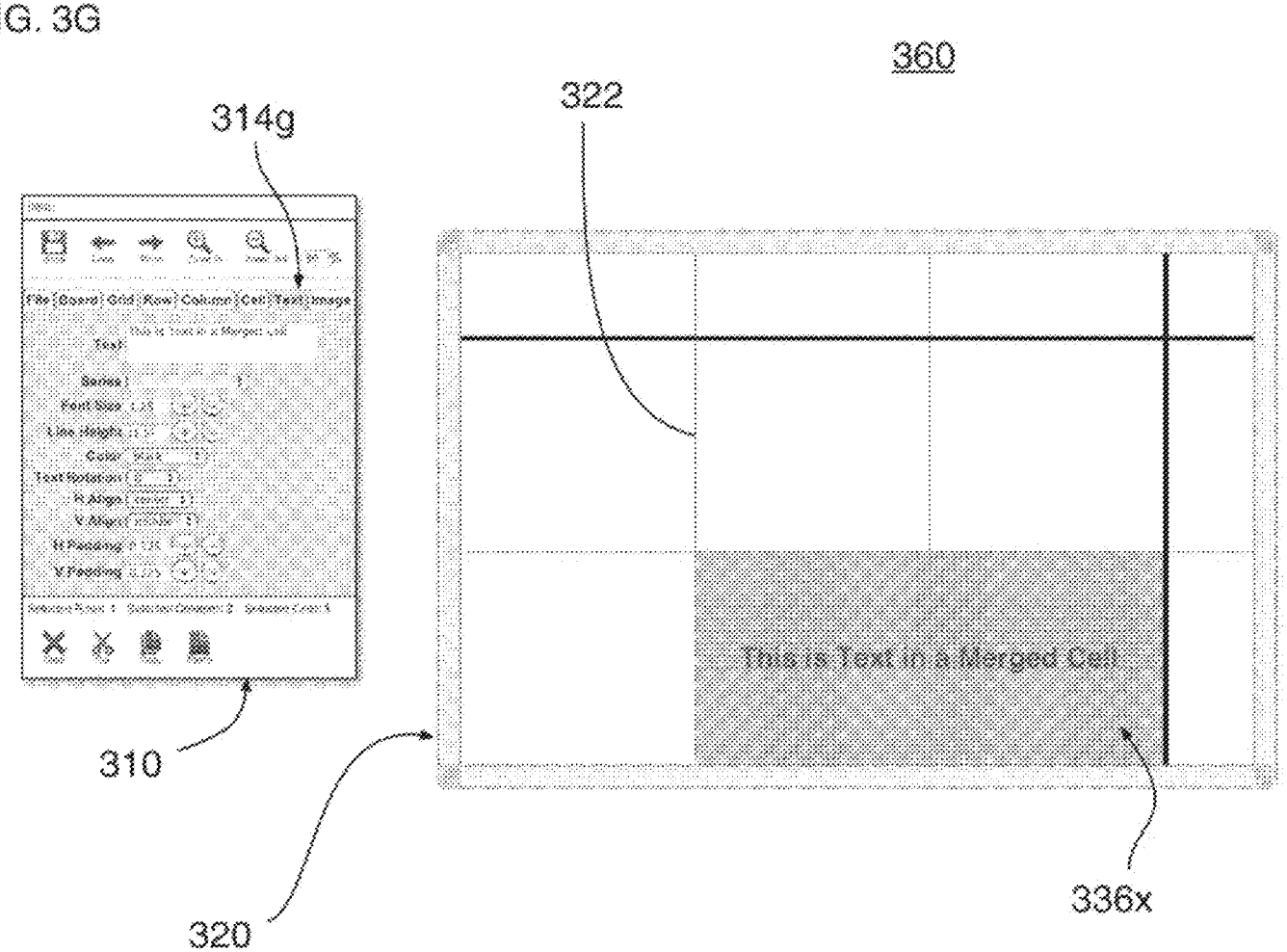

FIG. 3G is an illustration of an embodiment of a user interface screen image 360 associated with a product design page 220. Unlike FIG. 3E, the currently selected tab button within the dialog box 310 is the tab button 314g, labeled "Text". As shown, the entered text is arranged within the grid 322 and across almost the entire width of the merged cell 336x.

The dialog box 310 includes a text entry field labeled "Text", that displays user entered exemplary text herein reciting, "This is Text in a Merged Cell". The dialog box 310 also includes a menu selection fields labeled "Series", "Font Size", "Line Height", "Color", "Text Rotation", "H Align", "V Align", "H Padding" and "V Padding" and (2) text display fields that are each labeled "Height" and "Width", that each apply to a currently selected text located within a cell.

The "Font Size" field controls the size of the text characters that are input by the user. The "Line Height" field controls the height of a rectangular area occupied by a line of inputted text. The "Color" field controls the color of the inputted text. The "Text Rotation" field controls an angle which a line of text is displayed within the cell. The "H Align" field controls horizontal alignment of the inputted text. The "V Align" field controls vertical alignment of the inputted text. The "H Padding" field controls an amount of non text occupied space (white space) that is located in horizontal relation to inputted text. The "V Padding" field controls an amount of non text occupied space (white space) that is located in vertical relation to inputted text. In other embodiments, a Height and a Width field (not shown in FIG. 3G) can be added to the dialog box 310 of the Text tab 314g in order to respectively indicate a height value and a width value of selected text. Such a feature is not included within the embodiment of the Text tab 314g as shown in FIG. 3G, but can be implemented in other embodiments of the invention in a manner similar to that of the cell Height and Width fields of the Cell tab 314f, as shown in FIG. 3F.

The "Series" field enables a series of text values to be retrieved from outside of the user interface program. In one embodiment, text from a spread sheet is loaded into one or more cells. Optionally, each cell can include non-literal text which references a cell including literal text within the spreadsheet. The literal text is the actual text to be printed upon the manufactured product.

FIG. 4A is an illustration of an embodiment of a user interface screen 400 associated with a product design page 220. The dialog box 310 (upper left corner) indicates that tab button 314c, labeled "Grid" is selected. The display area window 320 includes a grid 322 having (3) rows and (3) columns and (9) cells. Currently, the content of the grid 322 is empty, meaning that the cells of the grid 322 include no text, no graphics and no other nested grids. A pointing device (mouse) cursor 330 is also shown as being currently located within the display area window 320. Also cell 336ba of the grid 322 is indicated as being selected (via the pointing device 330) and highlighted.

FIG. 4B is an illustration of an embodiment of a user interface screen 402 of FIG. 4A further including a nested grid 430 that is nested within cell 336ba. The dialog box 310 (upper left corner) indicates that tab button 314f, labeled "Cell" is selected. The dialog box 310 includes a menu field 426 labeled "Cell Content" and that indicates that a "grid" resides within the cell 336ba. The grid 430 is inserted into this cell 336ba via selection of the "grid" menu option within the Cell Content field 426.

FIG. 4C is an illustration of an embodiment of a user interface screen 404 of FIGS. 4A and 4B, further including a nested grid 440 that is nested within a (lower-left quadrant) cell of nested grid 430 (FIG. 4B). The dialog box 310 (upper left corner) indicates that tab button 314f, labeled "Cell" is selected. The dialog box 310 includes a menu field 426 labeled "Cell Content" and that indicates that a "grid" resides within the cell of nested grid 430. The nested grid 440 is inserted into this cell of the nested grid 430 via selection of the "grid" menu option within the Cell Content field 426. Also cell 322bc of the grid 322 is indicated as being selected and highlighted.

FIG. 4D is an illustration of an embodiment of a user interface screen 406 of FIGS. 4A-4C, further including a text field 442 that is located within a cell 430ab in an upper right quadrant of grid 430. The dialog box 310 indicates that tab button 314g, labeled "Text" is selected. The dialog box 310 includes a menu field 428 labeled "Text" and that indicates that a text string ("This is Text") resides within the text field 442 of the cell 430ab of grid 430. Also, cell 430ab of the nested grid 430 is indicated as being selected and highlighted.

FIG. 4E is an illustration of an embodiment of a user interface screen 408 of FIGS. 4A-4D, further including an image field 444 that is located within a cell 430bb. The dialog box 310 (upper left corner) indicates that tab button 314h, labeled "Image" is selected. The cell 430bb is located within a lower right quadrant of grid 430. The dialog box 310 indicates that tab button 314h, labeled "Image" is selected. The dialog box 310 includes a text entry field 432 labeled "Choose File" for specifying an image, such as a named .jpg (JPEG) file that can be uploaded and rendered within the currently selected cell and highlighted 430bb.

FIG. 4F is an illustration of an embodiment of a user interface screen image 410, like that of FIGS. 4A-4E, further including an image field 446 that is located within a merged cell 436y once occupied by cells 336bc and 336cc. The dialog box 310 (upper left corner) indicates that tab button 314f, labeled "Cell" is selected. The image field 446 is uploaded from an image file, such as a .jpg file, into the merged cell 436y.

As shown, each grid can be modified to include non-uniform attributes, such as a varying number of rows and columns that each can have different and varying dimensions relative to each other. These grids include cells that store various types of content including text, graphics and captured images and other grids, also referred to as nested grids.

FIG. 5 is an illustration of a more complex user interface screen grid 520 as defined within the display area window 320. As shown, the top level grid 520 includes two rows and one column forming an upper cell and a lower cell. An upper cell including a nested grid 522 and a lower cell including a nested grid 524. The nested grid 524 having (28) rows and (5) columns. Note that text reciting "SURGICAL LINEUP" resides within the other nested grid 522 having (2) rows and (4) columns. Cells within the (2) left most columns of this nested grid 522 have been merged together and enclose the text "SURGICAL LINEUP". Cells within the top row of the (2) right most columns enclose text reciting "DAY" followed by no text, from left to right respectively. Cells within the bottom row of the (2) right most columns store text reciting "DATE" followed by no text, from left to right respectively. The cells reciting no text are intended to function as empty (blank) fields of the manufactured product that can be hand written by a user of the manufactured product.

As illustrated in FIG. 5, although the user interface is designed to be simple to use, its use can yield rather complex images for the expression of a design of an object or for the expression of an image that can be used for other applications.

In summary, in one aspect, the invention is a method for communication of customized design information for an object to be manufactured, the design information including a visual representation of the object in accordance with directives provided by a person.

The method including the steps of providing a data communications channel between a person and a manufacturer, providing a user interface to the person via the communications channel that enables the person to construct a custom visual representation of a design for an object that is to be manufactured from a plurality of materials and that is to be printed upon with a least a portion of the visual representation, the user interface designed to enable the person to construct an image by locating and dimensioning at least one of text and graphics within at least one multi-cell grid template; and displaying the visual representation to the person and receiving approval from the person via the communication channel for proceeding to manufacture of the object; and manufacturing the object in accordance with the visual representation.

In some embodiments, the object includes at least one planar surface upon which the visual representation is marked. Optionally, the object could be a display board that functions, at least in part, as a image projecting surface. The display board could further function, at least in part, as a writing surface. The display board could further include at least one manufactured slot that functions to accommodate transfer of tangible objects through the image projecting surface. In this type of embodiment, the manufactured slot is located and dimensioned as specified in accordance with the visual representation. Optionally, the display board further functions, at least in part, as a sign.

In some embodiments, the method of claim 1 wherein the visual representation is constructed by the person (user) by interacting with the user interface so as to spatially arrange at least one of text and graphics in relation with a plurality of one or more grids. Optionally, there exists a hierarchical relationship between the plurality of grids. In this type of embodiment, at least one of the grids is defined having non-uniform attributes. Optionally, each grid can include a plurality of rows that are each assigned a separate and variable height dimension. Each variable dimensioned grid can include a plurality of columns that are each assigned a separate and variable width dimension. The hierarchical relationship provided by the user interface enables the person (user) to construct a second grid that is located within the boundaries of a cell of a first grid.

In another aspect, the invention provides for an apparatus to enable communication of customized design information of an object for manufacture, the design information including a visual representation of the object in accordance with design specific characteristics of the object provided by a person. The apparatus including a data communications channel between a person and a manufacturer, a user interface to the person via the communications channel that enables the person to construct a custom visual representation of a design for an object that is to be manufactured from a plurality of materials and that is to be printed upon with the visual representation, the user interface designed to enable the person to construct an image by locating and dimensioning at least one of text and graphics within at least a one multi-cell grid template. And where the user interface is configured for displaying the visual representation to the person and receiving approval from the person for proceeding to manufacture of the object; and where the apparatus is configured for manufacturing the tangible object in accordance with the visual representation.

In another aspect, the invention provides for an apparatus for drawing a visual representation, the apparatus including a user interface program that enables a user to construct an image by locating and dimensioning a hierarchy of grid patterns; and where each grid pattern is configurable to include a variable number of rows and columns, and where each of the rows and columns is configurable to have at least one variable dimension that is independent of a variable dimension of each of other rows and columns; and where cells within each grid pattern can include at least one of text, image, or another grid.

In another aspect, the invention provides for a system for enabling communication of customized design information of an object for manufacture, the design information including a visual representation of the object in accordance with design specific characteristics of the object provided by a person. The system including a data communications channel between a person and a manufacturer, a user interface to the person via the communications channel that enables the person to construct a custom visual representation of a design for an object that is to be manufactured from a plurality of materials and that is to be printed upon with the visual representation, the user interface is designed to enable the person to construct an image by locating and dimensioning at least one of text and graphics within at least one multi-cell grid template; and where the user interface is configured for displaying the visual representation to the person and receiving approval from the person for proceeding to manufacture of the object; and where the apparatus is configured for manufacturing the object in accordance with the visual representation.

It will be readily apparent that other modifications and variations are possible within the intended ambits of the present invention, according to the following claims:

The invention claimed is:

[1. A method for communication of customized design information for a display board to be manufactured, the design information including a visual representation of the display board in accordance with directives provided by a person, said method including the steps of:

providing a data communications channel between said person and a manufacturer;

providing a user interface to said person via said data communications channel that enables said person to construct a custom visual representation of a design for the display board that is to be manufactured from a plurality of materials and that is to be printed upon with a least a portion of said visual representation, said user interface having a plurality of controls designed to enable said person to construct an image by locating and dimensioning at least one of text and graphics within at least one constructed multi-cell grid template defined by a hierarchical relationship;

displaying said visual representation to said person including the constructed image;

enabling the constructed image including the at least one multi-cell grid template to be selectively adjusted by the person using the user interface in which the hierarchical relationship is defined by at least one root cell with dimensions inputted using the user interface, and wherein modifying the dimensions of an cell using the user interface automatically adjusts the dimensions of all descendent cells of the modified cell, for purposes of the constructed image;

receiving approval from said person via said data communication channel for proceeding to manufacture of said display board;

manufacturing said display board in accordance with said visual representation.]

[2. The method of claim 1 wherein said display board includes at least one planar surface upon which said visual representation is marked.]

[3. The method of claim 1, wherein said display board further functions, at least in part, as a writing surface.]

[4. The method of claim 1, wherein said display board further includes at least one manufactured slot that functions to accommodate transfer of tangible objects through said image projecting surface.]

[5. The method of claim 1, wherein said at least one manufactured slot is located and dimensioned as specified in accordance with said visual representation using said user interface.]

[6. The method of claim 1 wherein said display board further functions, at least in part, as a sign.]

[7. The method of claim 1 including the step of constructing the visual representation of the display board to be manufactured by interacting with said user interface so as to spatially arrange at least one of text and graphics in relation with a plurality of one or more grids in said template.]

[8. The method of claim 7 wherein said at least one of said grids is defined having non-uniform attributes.]

[9. The method of claim 7 wherein each said grid can include a plurality of rows that are each assigned a separate and variable height dimension.]

[10. The method of claim 7 wherein each variable dimensioned grid can include a plurality of columns that are each assigned a separate and variable width dimension.]

[11. The method of claim 1, wherein a pdf image of the user selected visual representation is transmitted to the manufacturer over a communication channel, the method including the step of printing the visual representation for direct application onto the display board.]

[12. The method of claim 11, wherein the directly printing step includes the steps of transmitting a pdf version of the visual representation to a printer and directly printing the visual representation of the at least one grid onto a substrate of the manufactured display board.]

[13. The method of claim 1, wherein the visual/representation is sent over the communication channel to the manufacturer, and wherein the manufacturer generates a pdf and transmits the pdf to the user for approval or confirmation.]

14. An apparatus to enable communication of customized design information of a display board for manufacture, the design information including a visual representation of the display board in accordance with design specific characteristics of the display board provided by a person, said apparatus including:

a data communications channel between a person and a manufacturer;

a user [interlace] *interface provided* to said person via said communications channel that enables said person to construct a custom visual representation of a design for the display board that is to be manufactured from a plurality of materials and that is to be printed upon with said visual representation, said user interface designed to enable said person to construct an image by locating and dimensioning at least one of text and graphics within at least one multi-cell grid template representative of the display board; and wherein said user interface being configured for displaying said visual representation, including the constructed image, to said person and for receiving approval from said person for proceeding to manufacture of said display board; and wherein said apparatus is configured for manufacturing said display board in accordance with said visual representation and in which the person approved visual representation is transmitted over the data communications channel to a printer for printing the visual representation directly onto a substrate of the manufactured display board and in which the at least one multi-cell grid template is defined by a multi-tiered hierarchical structure that comprises at least one root cell having initial dimensions inputted by the person using the user interface, wherein the apparatus is further configured to automatically adjust the dimensions of any descendent cell based on the modification of dimensions of any cell in the multi-tiered hierarchical structure.

15. An apparatus for drawing a visual representation of a display board, said apparatus including:

a user interface program that enables a user to construct an image representative of the display board by locating and dimensioning a hierarchy of grid patterns; and wherein each said grid pattern is configurable to include a variable number of rows and columns, and wherein each of said rows and columns is configurable to have at least one variable dimension that is independent of a variable dimension of each of other rows and columns and in which the hierarchy of the grid patterns is defined by at least one root cell having initial dimensions inputted by the user using the user interface program, the apparatus being configured to automatically adjust the dimensions of all descendent cells of the grid pattern based on a user-initiated modification to the dimensions of any single cell; and wherein cells within each said grid pattern can include at least one of text, image, or another grid and in which the user interface program is further configured to transmit a completed and approved image of the grid pattern-to a printer to permit direct application of the completed and approved image of the grid pattern onto a substrate of a manufactured display board.

16. A system for enabling communication of customized design information of a display [hoard far] *board for* manufacture, the design information including a visual representation of the display board in accordance with design specific characteristics of the display board provided by a person, said system including:

a data communications channel between a person and a manufacturer;

a user interface to said person via said communications channel that enables said person to construct a custom visual representation of a design for the display board that is to be manufactured from a plurality of materials and that is to be printed upon with said visual representation, said user interface configured to enable said person to construct an image by locating and dimensioning at least one of text and graphics within at least one multi-cell grid template and in which at least one multi-cell grid template is defined by a hierarchical structure including at least one root cell having initial dimensions defined by the person using the user interface, the system being configured to automatically adjust the dimensions of any descendent cells when the dimensions of a single cell are modified by the user; and wherein said user interface is further configured for displaying said visual representation to said person and receiving approval from said person before proceeding to manufacture of said display [hoard] *board*; and wherein said system is configured to automatically transmit the approved visual representation of the multi-cell grid template for manufacturing said display board in accordance with said visual representation in which the approved visual representation is directly applied onto the manufactured display board.

*17. A computer-implemented method programmed for execution in a computing environment that provides for a display of a visual representation of a customized display board using a computing device, wherein the visual representation of the customized display board is created from a visual representation of a pre-patterned display board, the method comprising:*

*a) providing a visual representation of a plurality of pre-patterned display boards, wherein each of the plurality of pre-patterned display boards include different pre-designed display area patterns, wherein each of the pre-designed display area patterns comprise:*

*i) a parent grid having a parent grid height and a parent grid width that define parent grid dimensions, wherein the parent grid includes at least one parent row and at least one parent column, wherein each parent row includes a height dimension and each parent column includes a width dimension, wherein the intersection of each parent row and each parent column define a parent cell, wherein each parent cell has parent cell dimensions that are defined by the height dimension and the width dimension of the respective intersecting parent row and parent column, and*

*ii) a child grid disposed within one of the parent cells, wherein the child grid includes a child grid height and a child grid width that define child grid dimensions, wherein the child grid dimensions are dependent upon the parent cell dimensions of the parent cell that the child grid is disposed within, wherein the child grid includes at least one child row and at least one child column, and wherein the intersection of each child row and each child column define a child cell;*

*b) providing for a selection of one of the plurality of pre-patterned display boards;*

*c) providing for a display of the selected one of the plurality of pre-patterned display boards and the respective pre-designed display area pattern;*

*d) allowing for an insertion of at least one multimedia display object within at least one of the parent cells or at least one of the child cells;*

*e) allowing for a selective adjustment of the parent cell dimensions of at least one of the parent cells, wherein the selective adjustment of the dimensions of the at least one of the parent cells results in an automatic adjustment of the parent cell dimensions of the respective other parent cells within the parent grid, and the child grid dimensions of any child grid disposed within the adjusted at least one parent cell; and*

*f) providing for a display of a visual representation of a customized display board including the insertion and selective adjustment of the pre-patterned display board provided in steps d) and e), wherein a change to the parent grid dimensions based on the display of the customized visual representation results in an automatic adjustment to the parent cell dimensions of each of the parent cells, and the child grid dimensions of any child grid disposed within the adjusted parent cells.*

*18. A method in accordance with claim 17, wherein the at least one multimedia display object includes at least one of text, a graphic, or an image.*

*19. A method in accordance with claim 17, further comprising the step of:*

*g) allowing for an insertion of a sub-child grid within at least one of the child cells, wherein the sub-child grid includes a sub-child grid height and a sub-child grid width that define sub-child grid dimensions, wherein the sub-child grid dimensions are dependent upon the child cell dimensions of the child cell that the sub-child grid is disposed within, and*

*wherein the step of providing for the display of the visual representation of the customized display board includes the insertion and selective adjustment of the pre-patterned display board provided in steps d), e) and g).*

*20. A method in accordance with claim 17, further comprising the step of storing the modified visual representation in a computer memory.*

*21. A method in accordance with claim 17, wherein the parent grid includes a first parent cell and a second parent cell, wherein the first parent cell and the second parent cell are disposed in the same parent row, and wherein the method further comprises the step of:*

*g) allowing for the first and second parent cells to be merged together to form a merged parent cell, wherein the merged parent cell has merged parent cell dimensions that are defined by the height dimension of the respective parent row of the first and second parent cells, and a sum of the width dimensions of the respective columns of the first and second parent cells, and*

*wherein the step of providing for the display of the visual representation of the customized display board includes the insertion and selective adjustment of the pre-patterned display board provided in steps d), e) and g).*

*22. A method in accordance with claim 17, wherein the parent grid includes a first parent cell and a second parent cell, wherein the first parent cell and the second parent cell are disposed in the same parent column, and wherein the method further comprises the step of:*

*g) allowing for the first and second parent cells to be merged together to form a merged parent cell, wherein the merged parent cell has merged parent cell dimensions that are defined by the width dimension of the respective parent column of the first and second parent cells, and a sum of the height dimensions of the respective rows of the first and second parent cells, and*

*wherein the step of providing for the display of the visual representation of the customized display board includes the insertion and selective adjustment of the pre-patterned display board provided in steps d), e) and g).*

*23. A computer-implemented computer program product defining an application program for providing a display of a visual representation of a customized display board using a computing device, wherein the visual representation of the customized display board is created from a visual representation of a pre-patterned display board, the computer program product comprising:*

*a non-transitory, tangible computer usable storage medium having computer usable code embodied therewith, the computer usable program code comprising:*

*a) computer usable code configured for providing a visual representation of a plurality of pre-patterned display boards, wherein each of the plurality of pre-patterned display boards include different pre-designed display area patterns, wherein each of the pre-designed display area patterns comprise:*

*i) a parent grid having a parent grid height and a parent grid width that define parent grid dimensions, wherein the parent grid includes at least one parent row and at least one parent column, wherein each parent row includes a height dimension and each parent column includes a width dimension, wherein the intersection of each parent row and each parent column define a parent cell, wherein each parent cell has parent cell dimensions that are defined by the height dimension and the width dimension of the respective intersecting parent row and parent column, and*

*ii) a child grid disposed within one of the parent cells, wherein the child grid includes a child grid height and a child grid width that define child grid dimensions, wherein the child grid dimensions are dependent upon the parent cell dimensions of the parent cell that the child grid is disposed within, wherein the child grid includes at least one child row and at least one child column, and wherein the intersection of each child row and each child column define a child cell;*

*b) computer usable code configured for providing for a selection of one of the plurality of pre-patterned display boards;*

*c) computer usable code configured for providing for a display of the selected one of the plurality of pre-patterned display boards and the respective pre-designed display area pattern;*

*d) computer usable code configured for allowing for an insertion of at least one multimedia display object within at least one of the parent cells or at least one of the child cells;*

*e) computer usable code configured for allowing for a selective adjustment of the parent cell dimensions of at least one of the parent cells, wherein the selective adjustment of the dimensions of the at least one of the parent cells results in an automatic adjustment of the parent cell dimensions of the respective other parent cells within the parent grid, and the child grid dimensions of any child grid disposed within the adjusted at least one parent cell; and*

*f) computer usable code configured for providing for a display of a visual representation of a customized display board including the insertion and selective adjustment of the pre-patterned display board provided in steps d) and e), wherein a change to the parent grid dimensions based on the display of the customized visual representation results in an automatic adjustment to the parent cell dimensions of each of the parent cells, and the child grid dimensions of any child grid disposed within the adjusted parent cells.*

*24. A computer-implemented method programmed for execution in a computing environment that provides for a hierarchal rendering of a visual representation of a display board on a display of a computing device, the method comprising:*

*providing a display board object including at least one display board attribute, wherein the at least one display board attribute includes display board dimensions of a visual representation of a display area;*

*providing a parent grid object including a plurality of parent grid attributes, wherein the plurality of parent grid attributes include a parent grid height and a parent grid width that define parent grid dimensions, wherein the plurality of parent grid attributes further include at least one parent row and at least one parent*

*column, wherein each parent row includes a height dimension and each parent column includes a width dimension that define parent cell dimensions, wherein the intersection of each parent row and each parent column define a parent cell;*

*providing a parent cell object for each parent cell, wherein the parent cell object includes at least one parent cell attribute and a parent cell content property, and wherein the at least one parent cell attribute includes parent cell dimensions that are defined by the height dimension and the width dimension of the respective intersecting parent row and parent column in the respective parent grid object;*

*providing a child grid object including a plurality of child grid attributes, wherein the plurality of child grid attributes include a child grid height and a child grid width that define child grid dimensions, wherein the plurality of child grid attributes further include at least one child row and at least one child column, wherein each child row includes a height dimension and each child column includes a width dimension, wherein the intersection of each child row and each child column define a child cell;*

*providing a child cell object for each child cell, wherein the child cell object includes at least one child cell attribute and a child cell content property, and wherein the at least one child cell attribute includes child cell dimensions that are defined by the height dimension and the width dimension of the respective intersecting child row and child column in the respective child grid object;*

*rendering the visual representation of the display area on a display of a computer device using the display board object, wherein the display area is defined by the display board dimensions;*

*rendering a parent grid on the virtual representation of the display area using the parent grid object including the plurality of parent grid attributes, wherein the rendered parent grid includes the at least one display board attribute whereby the parent grid dimensions are equal to and dependent upon the display board dimensions;*

*associating the child grid object with the parent cell content property of one of the parent cell's; and*

*rendering a child grid on the virtual representation of the display area within the associated parent cell using the child grid object including the plurality of child grid attributes, wherein the rendered child grid includes the at least one parent cell attribute whereby the child grid dimensions are equal to and dependent upon the parent cell dimensions.*

*25. A method in accordance with claim 24, wherein the parent cell content property includes at least one multimedia display object.*

*26. A method in accordance with claim 25, wherein the at least one multimedia display object includes at least one of a text object, an image object, or a graphic object, wherein the text object is configured to include text for display within a respective parent cell, wherein the image object is configured to include an image for display within a respective parent cell, and wherein the graphic object is configured to include a graphic for display within a respective parent cell.*

*27. A method in accordance with claim 26, wherein the text includes one or more text properties, and wherein the one or more text properties is at least one of font, size, and weight.*

*28. A method in accordance with claim 27, wherein the size of the text is dependent upon the parent cell dimensions.*

*29. A method in accordance with claim 24, wherein the parent cell content property of at least one parent cell object is a null value.*

*30. A method in accordance with claim 24, wherein the child cell content property includes at least one multimedia display object.*

*31. A method in accordance with claim 30, wherein the at least one multimedia display object includes at least one of a text object, an image object, or a graphic object, wherein the text object is configured to include text for display within a respective child cell, wherein the image object is configured to include an image for display within a respective child cell, and wherein the graphic object is configured to include a graphic for display within a respective child cell.*

*32. A method in accordance with claim 31, wherein the text includes one or more text properties, and wherein the one or more text properties is at least one of font, size, and weight.*

*33. A method in accordance with claim 32, wherein the size of the text is dependent upon the child cell dimensions.*

*34. A method in accordance with claim 24, wherein the child cell content property of at least one child cell object is a null value.*

*35. A method in accordance with claim 24, wherein the at least one parent column and the at least one parent row in the parent grid object are defined by one or more lines in the visual representation of the display area.*

*36. A method in accordance with claim 35, wherein the one or more lines include one or more properties, and wherein the one or more properties include at least one of thickness or color.*

*37. A method in accordance with claim 24, wherein at least one of the parent cells in the parent cell object is defined by at least one line in the visual representation of the display area.*

*38. A method in accordance with claim 37, wherein the at least one line includes one or more properties, and wherein the one or more properties include at least one of thickness or color.*

*39. A method in accordance with claim 24, wherein the height dimension for each parent row an independent and variable height dimension, and wherein the width dimension for each parent column is an independent and variable width dimension.*

*40. A method in accordance with claim 24, wherein the height dimension for each child row an independent and variable height dimension, and wherein the width dimension for each child column is an independent and variable width dimension.*

*41. A method in accordance with claim 24, further comprising the steps of:*

*providing a content object including the display board object, the parent grid object, the parent cell object, the child grid object, and the child cell object; and*

*transforming the content object into hypertext markup language (HTML) prior to rendering the visual representation of the display area, the parent grid on the virtual representation of the display area, and the child grid on the virtual representation of the display area within the associated parent cell.*

*42. A computer-implemented computer program product defining an application program for providing a display of a visual representation of a customized display board using a computing device, wherein the customized display board is*

*created from a pre-patterned display board, the computer program product comprising:*

*a non-transitory, tangible computer usable storage medium having data stored therein representing the application program executable by the computing device, the application program including:*

*a) instructions for displaying a visual representation of a plurality of pre-patterned display boards, wherein each of the plurality of pre-patterned display boards include different pre-designed display area patterns, wherein each of the pre-designed display area patterns comprise:*

*i) a parent grid having a parent grid height and a parent grid width that define parent grid dimensions, wherein the parent grid includes at least one parent row and at least one parent column, wherein each parent row includes a height dimension and each parent column includes a width dimension, wherein the intersection of each parent row and each parent column define a parent cell, wherein each parent cell has parent cell dimensions that are defined by the height dimension and the width dimension of the respective intersecting parent row and parent column, and*

*ii) a child grid disposed within one of the parent cells, wherein the child grid includes a child grid height and a child grid width that define child grid dimensions, wherein the child grid dimensions are dependent upon the parent cell dimensions of the parent cell that the child grid is disposed within, wherein the child grid includes at least one child row and at least one child column, and wherein the intersection of each child row and each child column define a child cell;*

*b) instructions for selecting one of the plurality of pre-patterned display boards;*

*c) instructions for displaying the selected one of the plurality of pre-patterned display boards and the respective pre-designed display area pattern;*

*d) instructions for inserting at least one multimedia display object within at least one of the parent cells or at least one of the child cells;*

*e) instructions for selectively adjusting the parent cell dimensions of at least one of the parent cells, wherein the selective adjustment of the dimensions of the at least one of the parent cells results in an automatic adjustment of the parent cell dimensions of the respective other parent cells within the parent grid, and the child grid dimensions of any child grid disposed within the adjusted at least one parent cell; and*

*f) instructions for displaying a visual representation of a customized display board including the insertion and selective adjustment of the pre-patterned display board provided in steps d) and e), wherein a change to the parent grid dimensions based on the display of the customized visual representation results in an automatic adjustment to the parent cell dimensions of each of the parent cells, and the child grid dimensions of any child grid disposed within the adjusted parent cells.*

* * * * *